US011552380B2

(12) United States Patent
Gumann et al.

(10) Patent No.: US 11,552,380 B2
(45) Date of Patent: *Jan. 10, 2023

(54) REDUCED KAPITZA RESISTANCE MICROWAVE FILTER FOR CRYOGENIC ENVIRONMENTS

(71) Applicant: International Business Machines Corporation, Armonk, NY (US)

(72) Inventors: Patryk Gumann, Tarrytown, NY (US); Salvatore Bernardo Olivadese, Stamford, CT (US)

(73) Assignee: INIERNATIONAL BUSINESS MACHINES CORPORATION, Armonk, NY (US)

( * ) Notice: Subject to any disclaimer, the term of this patent is extended or adjusted under 35 U.S.C. 154(b) by 101 days.

This patent is subject to a terminal disclaimer.

(21) Appl. No.: 17/070,458

(22) Filed: Oct. 14, 2020

(65) Prior Publication Data

US 2021/0111469 A1    Apr. 15, 2021

Related U.S. Application Data

(62) Division of application No. 16/149,837, filed on Oct. 2, 2018, now Pat. No. 10,897,069.

(51) Int. Cl.
*H01P 11/00* (2006.01)
*H01P 1/203* (2006.01)
(Continued)

(52) U.S. Cl.
CPC ............ *H01P 11/001* (2013.01); *G06N 10/00* (2019.01); *H01B 12/02* (2013.01); *H01P 1/20* (2013.01);
(Continued)

(58) Field of Classification Search
CPC .......... H01P 11/003; H01P 1/20; H01P 1/203; H01B 12/02
(Continued)

(56) References Cited

U.S. PATENT DOCUMENTS 4,918,050 A    4/1990  Dworsky et al.
5,484,764 A *  1/1996  Fiediuszko ......... H01P 1/20381
                                                    333/204
(Continued)

FOREIGN PATENT DOCUMENTS

CN    1336018 A     2/2002
CN    203674351 U   6/2014
(Continued)

OTHER PUBLICATIONS

Slighter et al., "Millikelvin thermal and electrical performance of lossy transmission line filters," Mar. 11, 2009, arxiv:0903.1895v1 [cond-mal.supr-con], 4 pages.
(Continued)

*Primary Examiner* — Rakesh B Patel
(74) *Attorney, Agent, or Firm* — Amin, Turocy & Watson, LLP

(57) ABSTRACT

An architecture for, and techniques for fabricating, a thermal decoupling device are provided. In some embodiments, thermal decoupling device can be included in a thermally decoupled cryogenic microwave filter. In some embodiments, the thermal decoupling device can comprise a dielectric material and a conductive line. The dielectric material can comprise a first channel that is separated from a second channel by a wall of the dielectric material. The conductive line can comprise a first segment and a second segment that are separated by the wall. The wall can facilitate propagation of a microwave signal between the first segment and the
(Continued)

second segment and can reduce heat flow between the first segment and the second segment of the conductive line.

13 Claims, 15 Drawing Sheets

(51) Int. Cl.
*H01B 12/02* (2006.01)
*H01P 1/30* (2006.01)
*G06N 10/00* (2022.01)
*H01P 1/20* (2006.01)
*H01P 3/00* (2006.01)
*H05K 7/20* (2006.01)
*H01P 1/22* (2006.01)

(52) U.S. Cl.
CPC ............... *H01P 1/203* (2013.01); *H01P 1/30* (2013.01); *H01P 3/003* (2013.01); *H01P 11/007* (2013.01); *H05K 7/20372* (2013.01); *H01P 1/222* (2013.01)

(58) Field of Classification Search
USPC .................................................. 333/204, 205
See application file for complete search history.

(56) References Cited

U.S. PATENT DOCUMENTS

| | | | |
|---|---|---|---|
| 7,540,656 | B1 | 6/2009 | Stochl et al. |
| 8,745,850 | B2 | 6/2014 | Farinelli et al. |
| 9,464,947 | B2 | 10/2016 | Saraie et al. |
| 10,897,069 | B2 * | 1/2021 | Gumann ............... H01P 11/001 |
| 2002/0024404 | A1 | 2/2002 | Fuke et al. |
| 2008/0018421 | A1 | 1/2008 | Akasegawa et al. |
| 2009/0121814 | A1 | 5/2009 | Hielscher et al. |
| 2009/0181226 | A1 * | 7/2009 | Ning ................... H05K 3/1258 |
| | | | 428/209 |
| 2017/0373658 | A1 | 12/2017 | Thom et al. |
| 2020/0035901 | A1 | 1/2020 | Olivadese et al. |

FOREIGN PATENT DOCUMENTS

| | | |
|---|---|---|
| CN | 104752793 A | 7/2015 |
| CN | 105131897 A | 12/2015 |
| CN | 105762477 A | 7/2016 |
| CN | 108232398 A | 6/2018 |
| JP | 2001-217608 A | 8/2001 |
| JP | 2006-262396 A | 9/2006 |
| KR | 10-1163070 B1 | 7/2012 |
| KR | 101163070 B1 | 7/2012 |
| WO | 2017/110700 A1 | 6/2017 |

OTHER PUBLICATIONS

Chapman et al., "Widely Tunable On-Chip Microwave Circulator for Superconducting Quantum Circuits," Physical Review X, 2017, vol. 7, No. 4, American Physical Society, 16 pages.

International Search Report and Written Opinion received for PCT Application Serial No. PCT/EP2019/075302 dated Dec. 10, 2019, 17 pages.

Non-Final Office Action received for U.S. Appl. No. 16/149,837 dated May 15, 2020, 23 pages.

Chinese Office Action for Chinese Application Serial No. 201980063990.4 dated Aug. 2, 2021, 12 pages.

Slichter et al., "Millikelvin thermal and electrical performance of lossy transmission line filters," Mar. 11, 2009, arXiv:0903.1895v1 [cond-mat.supr-con], 4 pages.

Office Action for U.S. Appl. No. 16/149,837 dated May 15, 2020, 23 pages.

Communication pursuant to Article 94(3) EPC received for E.P Patent Application Serial No. 19773415.5 dated May 3, 2022, 9 pages.

Anonymous, "Oxygen-free copper—Wikipedia", Retrieved from Internet: URL: https://en.wikipedia.org/wiki/Oxygen-free_copper, Jan. 9, 2018, 4 pages.

Office Action received for Chinese Patent Application Serial No. 201980063990.4 dated Mar. 23, 2022, 6 pages.

* cited by examiner

REDUCED KAPITZA RESISTANCE MICROWAVE FILTER FOR CRYOGENIC ENVIRONMENTS

TECHNICAL FIELD AND BACKGROUND

The subject disclosure generally relates to microwave filter components with segmented or discontinuous signal conductors that, in a cryogenic environment where temperatures are very low, exhibit reduced Kapitza resistance.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference.

Hence, a fundamental element of quantum computing is the quantum bit (qubit). A qubit represents a quantum mechanical system where information can be encoded and manipulated. A significant aspect of a qubit is coherence time, which represents how long a quantum state of the qubit can be maintained.

A successful implementation of quantum computing will likely exponentially extend the computing power of current computational systems, having the potential to revolutionize numerous technological fields. Today, there are many suggested approaches to implementing a quantum computing device. One of the most feasible approaches to implementation of a quantum computing architecture is based on superconducting devices, which are typically implemented in a cryogenic environment. A cryogenic environment can be one with very low pressure (e.g., a vacuum or near-vacuum) and very low temperature. For example, a cryogenic environment may exhibit temperatures below about 100 degrees Kelvin (K) and can be as low as about 10 millikelvin (mK) or less, such as in a superconducting based quantum computing environment.

The performance of any superconducting based quantum computing architecture is heavily depended on the quality of the superconducting quantum bits (e.g., qubits), which can be directly characterized by the measuring coherence times and qubit errors. These coherence times and qubit errors strongly depend on the performance of microwave hardware (e.g., filter devices) at low temperatures.

While microwave filters do exist, even some that are commercially advertised to be suitable for cryogenic environments, existing microwave filters do not appear to be designed or tested to operate at temperatures lower than 77 K, not to mention the temperatures (e.g., near or below 10 mK) that might accompany a superconducting based quantum computing implementation.

Hence, a technical problem arises in the field of quantum computing in that, at certain cryogenic temperatures (e.g., below about 77 K), existing microwave frequency filters or attenuators can behave in unexpected ways. For example, elements of a microwave filter or attenuator, in a cryogenic environment, may become superconductive, and no longer function to pass, filter, or attenuate the signal based on frequency. The inventors have identified that these technical problem arises due at least in part to two distinct technical problems.

A first technical problem arises due to the fact that signal conductors such as coaxial cables or other hardware cross numerous temperature zones, typically spanning from room temperature environments to cryogenic environments. Hence, the elements of the signal conductor, which can include a conductive line to propagate the signals as well as a dielectric sheath or substrate, can have dramatic temperature differences. For example, a conductive line employed to propagate a signal from a room temperature environment to a cryogenic environment may vary in temperature by 300 K. The inventors have identified that such significant temperature differences between different portions of the conductive line propagating a signal can cause thermal noise resulting from thermal flow or the exchange of heat between one portion of the conductive line to another portion of the conductive line. This thermal noise can degrade the performance of microwave hardware, which can in turn degrade qubit performance.

While the first technical problem relates to difficulties encountered due to heat flow within a single material (e.g., the conductive line), a second distinct technical problem arises due to difficulties associated with heat flow between different materials. The second technical problem arises due to a phenomenon known as Kapitza resistance, which tends to be negligible at room temperature or above cryogenic temperatures but can become very significant at cryogenic temperatures. Kapitza resistance refers to a thermal resistance effect at a boundary between different materials in the presence of a heat flux. In other words, Kapitza resistance can prevent various materials within a low temperature environment from settling at a uniform temperature.

For example, suppose an ambient temperature and/or the temperature flux across the interface between the two materials in a cryogenic refrigerator is 10 mK. Microwave hardware within that environment can comprise a conductive line formed in a dielectric, where the electrically conductive line can provide filtering, for instance by passing or attenuating the microwave signal based on frequency. The dielectric might be cooled to 10 mK. However, the conductive line, which in operation may represent a source of heat, may not effectively transfer heat from the conductive line to the dielectric due in part to the Kapitza resistance phenomenon. Thus, the conductive line might remain at a temperature significantly higher than the ambient environment and/or the dielectric in which the conductive line is situated. The inventors have identified that a temperature difference between the dielectric and the conductive line can cause various problems such as low frequency noise, unexpected behavior, and others, any one of which can negatively impact the quality of qubits (e.g., coherence times and qubit errors) of a quantum computing device that relies on the microwave hardware.

A third technical problem arises due to an inability to thermalize the conductive line, which can be a source of heat in the system. The third technical problem can arise due to various materials used to implement the microwave hardware exhibiting insufficient thermal conductivity between two different materials such as between the conductive line and the dielectric. Traditionally, dielectric materials and conductive materials are selected based on electrical properties and cost, with little or no consideration for thermal properties.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatus and/or products are described that facilitate at least one of reduced thermal flow within a material or facilitate reduced Kapitza resistance at a boundary between two different materials.

According to an embodiment of the present invention, a thermal decoupling device can be provided. The thermal decoupling device can comprise a dielectric material. The dielectric material can comprise a first channel that is separated from a second channel by a wall of the dielectric material. The thermal decoupling device can further comprise a conductive line. The conductive line can comprise a first segment and a second segment that are separated by the wall. The wall can facilitate propagation of a microwave signal between the first segment and the second segment and can reduce heat flow between the first segment and the second segment of the conductive line. An advantage provided by this thermal decoupling device can be reduced thermal noise due to heat flow within the conductive line that spans multiple temperature zones. In some embodiments, the first and second channels can be arranged in a pattern that facilities a filter operation on a microwave signal propagated in a cryogenic environment having a temperature below about 77 degrees Kelvin. An advantage of this arrangement is that the thermal decoupling device can be integrated into a filter device providing a thermally decoupled filter device.

According to an embodiment of the present invention, a thermally decoupled cryogenic microwave filter device can be provided. The thermally decoupled cryogenic microwave filter device can comprise a dielectric having discontinuous channels in a pattern that facilitates a filter operation on a microwave signal propagated in a cryogenic environment having a temperature below about 77 degrees Kelvin (K). The discontinuous channels can comprise a first channel that is separated from a second channel by a wall of the dielectric. The thermally decoupled cryogenic microwave filter device can further comprise a conductive line. The conductive line can comprise a first segment, situated in the first channel, and a second segment, situated in the second channel. The first and second segments can be separated by the wall. The wall can facilitate propagation of the microwave signal between the first segment and the second segment and can reduce heat flow between the first segment and the second segment of the conductive line. An advantage provided by this thermally decoupled cryogenic microwave filter device can be improved performance at very low temperatures such as temperatures associated with a cryogenic environment in which a quantum computing architecture can be implemented. For example, heat flow within a conductive line can cause thermal noise. Such can be mitigated by thermally decoupling various segments of a discontinuous conductive line. In some embodiments, the wall can have dimensions determined to propagate the microwave signal based on the microwave signal having a frequency above about one gigahertz (GHz). An advantage provided is that even though the conductive line is discontinuous, and therefore may not be suitable for direct current applications, signals with sufficiently high frequency can be propagated between the discontinuous segments of the conductive line.

According to an embodiment of the present invention, a method can be provided. The method can be, e.g., a method for fabricating a thermal decoupling device. The method can comprise forming, by a fabrication device, discontinuous channels in a dielectric. The discontinuous channels can have a pattern comprising a first channel that is separated from a second channel by a wall of the dielectric material. The method can further comprise, forming, by the fabrication device, a conductive line in the discontinuous channels of the dielectric material. The conductive line can comprise a first segment and a second segment. The first segment and the second segment can be separated by the wall that facilitates propagation of a microwave signal between the first segment and the second segment and reduces heat flow between the first segment and the second segment of the conductive line. An advantage provided by this method can be reduced thermal noise due to heat flow within the conductive line that spans multiple temperature zones. In some embodiments, the forming the conductive line can comprise sintering a conductive material in the discontinuous channels. An advantage provided by sintering the conductive line can be that Kapitza resistance between the conductive line and the substrate can be reduced due to increased surface contact area between the conductive line and the substrate.

According to an embodiment of the present invention, a method can be provided. The method can be, e.g., for fabricating a thermally decoupled cryogenic microwave filter. The method can comprise forming, by a fabrication device, a dielectric that operates as an electrical insulator and a thermal conductor at cryogenic temperatures below about 77 degrees Kelvin (K). The dielectric can comprise a material having a thermal conductivity that is above about 200 watts per meter-Kelvin (W/m-K) at 77 K. The method can further comprise forming, by the fabrication device, discontinuous channels in the dielectric. The discontinuous channels can be formed in a pattern that facilitates a filter operation on a microwave signal propagated in the cryogenic environment. The discontinuous channels can comprise a first channel and a second channel separated by a wall of the dielectric. Further still, the method can comprise, sintering, by the fabrication device, a conductive material in the discontinuous channels having the pattern. Such can result in a conductive line comprising a first segment and a second segment that are separated by the wall that facilitates propagation of the microwave signal through the conductive line and reduces heat flow between the first segment and the second segment of the conductive line. An advantage provided by this method can be reduced thermal noise along the conductive line. Another advantage can be reduced Kapitza resistance between the conductive line and the dielectric. Reduction of thermal noise and reduction of Kapitza resistance can lead to improved performance at very low temperatures such as temperatures associated with a cryogenic environment in which a quantum computing architecture can be implemented. For example, Kapitza resistance can be reduced by increasing surface contact area between the conductive line and the substrate. Sintering the conductive line can result in an increased surface contact area between the conductive line and the substrate.

According to an embodiment of the present invention, a thermal decoupling product formed by a process can be provided. The process can comprise forming, by a fabrication device, a first channel that is separated from a second channel by a wall of the dielectric material. The process can further comprise forming, by the fabrication device, a conductive line. The conductive line can comprise a first segment, formed in the first channel, and a second segment, formed in the second channel. The first segment and the second segment can be separated by the wall. The wall can allow propagation of a microwave signal between the first segment and the second segment and reduces heat flow between the first segment and the second segment of the conductive line. An advantage provided by this process can result in a thermal decoupling product that can, via discontinuous segments of the conductive line, reduce heat flow between the various discontinuous segments of the conductive line. Reducing the heat flow can result in less thermal noise associated with the conductive line, which can provide an improved signal.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

As has been noted above, subject matter disclosed herein can address distinct technical problems. For example, a first technical problem arises due to thermal noise that results from heat flow within a single material that spans multiple temperature zones, which is primarily discussed in connection with FIGS. 1-3 of this disclosure. A second technical problem arises due to Kapitza resistance that operates at interfaces between two different materials, which is primarily discussed in connection with FIGS. 4-6 of this disclosure.

Figure 1:
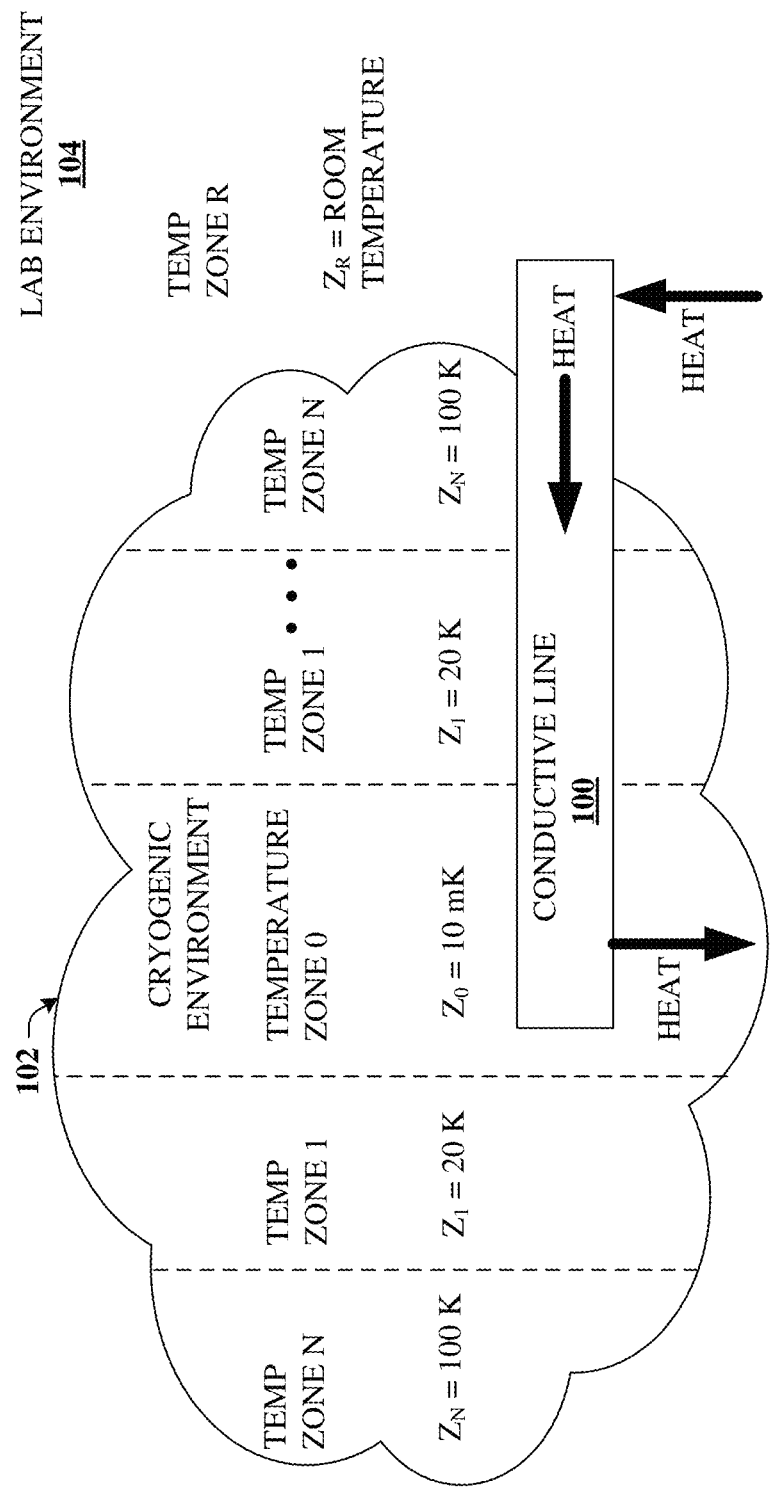
FIG. 1 illustrates a diagram of a conductive line that physically extends through numerous temperature environments in accordance with one or more embodiments.

Turning now to the drawings, with initial reference to FIG. 1, a diagram is illustrated of a conductive line 100 that physically extends through numerous temperature environments in accordance with one or more embodiments. Conductive line 100 is illustrated as a continuous line or piece of wire that can be utilized to convey a signal between cryogenic environment 102 and lab environment 104. Portions of conductive line 102 may be embodied as a coaxial cable or another suitable configuration. Conductive line 100 may be employed in connection with a superconducting quantum computing device, which is typically implemented in cryogenic environment 102, where temperatures are very low.

Cryogenic environment 102 can be implemented inside a cryogenic refrigerator that can have multiple stages, with each stage exhibiting different temperatures. Thus, within cryogenic environment 102, some positive integer, N, temperature zones can exist. As illustrated, the core of cryogenic environment 102, representing temperature zone 0, can be very close to absolute zero an example of which can be 10 millikelvin (mK). Other stages of cryogenic environment 102 can exhibit different temperatures ranging from about 10 mK to about 100 K. Beyond cryogenic environment 102, such as outside the cryogenic refrigerator, the ambient temperature, illustrated as temperature zone R, can be room temperature, which may be near 300 K.

Thus, conductive line 100 used to relay signals between the core of cryogenic environment 102 and lab environment 104 may operate not only as current path but as a heat path as well. For example, a direct current path typically relies on a continuous conductive line (e.g., conductive line 100), but a continuous conductive line is also an effective thermal path. As illustrated, heat will tend to flow into conductive line 100 at areas in temperature zone R, while flowing out of conductive line 100 at areas in temperature zones 0-N. In effect, heat will significantly tend to flow toward temperature zone 0.

The inventors have observed that such heat flow can cause thermal noise, which can negatively affect the quality of a signal being conveyed by conductive line 100 or negatively affect devices served by conductive line 100. For example, the thermal noise can reduce the performance of a filter device or reduce the quality of a superconductive qubit of a quantum computing device. Hence, thermal noise represents a technical problem. Mitigating this thermal noise can improve performance of filter devices, quantum computing devices, and other devices or systems. A technique to reduce or mitigate thermal noise resulting from heat flow within a conductive line can be found in connection with FIG. 2.

Figure 2:
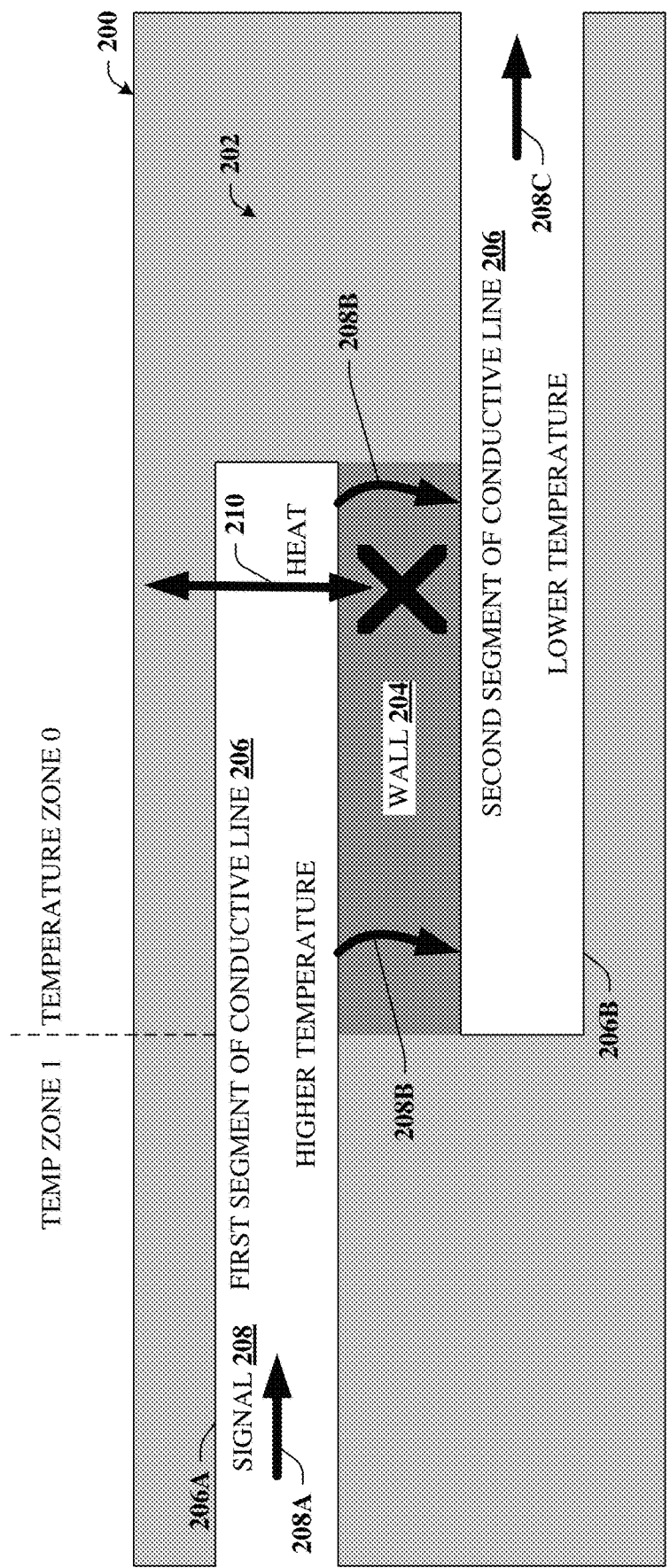
FIG. 2 illustrates a block diagram of a thermal decoupling device that can propagate a signal while reducing heat flow in accordance with one or more embodiments.

With reference now to FIG. 2, a block diagram of thermal decoupling device 200 is illustrated that can propagate a signal while reducing heat flow in accordance with one or more embodiments. Repetitive description of like elements employed in other embodiments described herein is omitted for sake of brevity. Such can be accomplished by segmenting a conductive line into two or more discontinuous segments.

For example, thermal decoupling device 200 can comprise dielectric material 202, which can be a sheath, conduit, or substrate depending on implementation. Dielectric material 202 can be any suitable material, although certain materials or properties can be favored, such as a reduced Kapitza resistance property further detailed in connection with FIG. 6. Dielectric material 202 can comprise a first channel that is separated from a second channel by a wall 204 of the dielectric material 202. The first channel and the second channel can be filled or occupied by discontinuous segments of a conductive line 206, as detailed below. In some embodiments, the first channel and the second channel can extend in directions that are substantially parallel. By proxy, a first segment and a second segment of the conductive line can extend in directions that are substantially parallel.

Wall 204 is depicted in dark grey to illustrate a separation between the first channel and the second channel, while the remainder of dielectric material 202 is illustrated in light grey. In some embodiments, wall 204 can be substantially identical to, or have substantially similar properties as, dielectric material 202. In some embodiments, wall 204 can be composed of a different material having different properties than dielectric material 202.

Thermal decoupling device 200 can further comprise conductive line 206. Rather than being a continuous conductive line employed in other systems, conductive line 206 can be discontinuous or segmented. For example, conductive line 206 can comprise first segment 206A and second segment 206B, which can respectively occupy the first channel and the second channel of dielectric material 202. Hence, first segment 206A and second segment 206B can be separated by wall 204. Wall 204 can be configured to facilitate propagation of a signal 208 between first segment 206A and second segment 206B and reduce heat flow between first segment 206A and second segment 206B.

According to standard models, signals (e.g., signal 208) can propagate through a conductor (e.g., conductive line 206) via a flow of electrons. If these electrons are in a relatively low energy state, which is typical for direct current (DC) applications, a continuity of the conductor is relied on to convey signal 208. Thus, it can be readily observed that signal 208 can be propagated through first segment 206A. Signal portion 208A illustrates signal 208 being propagated through first segment 206A. However, for DC-type applications, signal 208 may not be capable of flowing to second segment 206B due to the discontinuity in conductive line 206 caused by wall 204.

However, at high frequencies, such as frequencies within a microwave spectrum, signal 208 can cause the electrons of conductive line 206 to become excited, representing a higher energy state. In this higher energy state, electrons can jump from one conductor to another conductor in sufficient proximity. In other words, wall 204 effectively operates as a capacitor and signal 208 can be conveyed from first segment 206A to second segment 206B, which is illustrated by signal portion 208B. Once passed wall 204, signal 208 can be conveyed along second segment 206B, which is illustrated by signal portion 208C The microwave spectrum is generally considered to be from about 300 megahertz (MHz) to about 300 gigahertz (GHz). Depending on various factors, including the dimensions of wall 204, lower frequencies may sufficiently excite electrons to cause the above-described effect. Thus, signal 208 is not necessarily limited to frequencies at or above the microwave spectrum, but such is a suitable threshold for many technical applications.

For typical quantum computing applications or for cryogenic frequency filters or other hardware, signal 208 will typically have a frequency above about one GHz. Hence, in some embodiments, wall 204 can have dimensions determined to propagate signal 208 having a frequency above about one GHz. Although many dimensions are suitable, as one example, a thickness (e.g., a distance between first segment 206A and second segment 206B) of wall 204 can be about 0.6 millimeters. Such a thickness can allow signal 208 to propagate between first segment 206A and second segment 206B, yet still reduce heat flowing between first segment 206A and second segment 206B, which is illustrated by reference numeral 210. However, it is understood that other dimensions can be suitable and such can vary based on implementation. Such will typically be in a range bounded by a maximum thickness for which a given signal 208 can pass wall 204, which is heavily influenced by the frequency of signal 208, and a minimum thickness that still sufficiently reduces heat flow between first segment 206A and second segment 206B, which is heavily influenced by the materials or thermal properties of wall 204.

Recall that conductive line 206 might extend through many different temperature zones, potentially ranging from about 300 K to less than 1 K. Hence, substantial portions of first segment 206A and second segment 206B might be in different temperature zones, which can result in a those two segments having markedly different temperatures. However, heat flow within conductive line 206 can be limited within a given segment, which can reduce thermal noise. In this example, much of the displayed portions of first segment 206A is in temperature zone 1, while the entirety of the displayed portions of second segment 206B is in temperature zone 0. Thus, first segment 206A can exhibit a first mean temperature that is higher than a second mean temperature of second segment 206B. In some embodiments, first segment 206A can stably remain at a different temperature than second segment 206B, while signal 208 can still be propagated between the two.

In effect, first segment 206A and second segment 206B can be thermally decoupled by thermal decoupling device 200. Heat can be free to flow within a given segment, but heat flow between two different segments can be reduced. As one advantage, given that heat flow can be reduced by wall 204, thermal noise resulting from such heat flow through conductive line 206 can be significantly reduced. As another advantage, operation of the associated cryogenic refrigerator device can be more efficient or more effective, since a continuous flow path from room temperature zones to the core of the cryogenic environment has been removed by segmenting conductive line 206.

Turning back to FIG. 1, it can be appreciated that thermal decoupling device 200 can be advantageously implemented at the boundaries between various temperature zones of cryogenic environment 102 such as at the boundaries between various stages of an associated cryogenic refrigerator. For example, consider one or more thermal decoupling device 200 situated at a boundary between temperature zone N (e.g., 100 K) and temperature zone R (e.g., 300 K). A first segment of conductive line 100 situated in temperature zone N need not be exposed to heat flow from a second segment of conductive line 100 that is situated in temperature zone R. Rather, the first segment can find some thermal equilibrium at or near 100 K, while the second segment can find some thermal equilibrium at or near 300. However, the signal can still be propagated between the first segment and the second segment. Another advantage of thermal decoupling device 200 can be used in connection with filter devices, an example of which is detailed with reference to FIG. 3.

Figure 3:
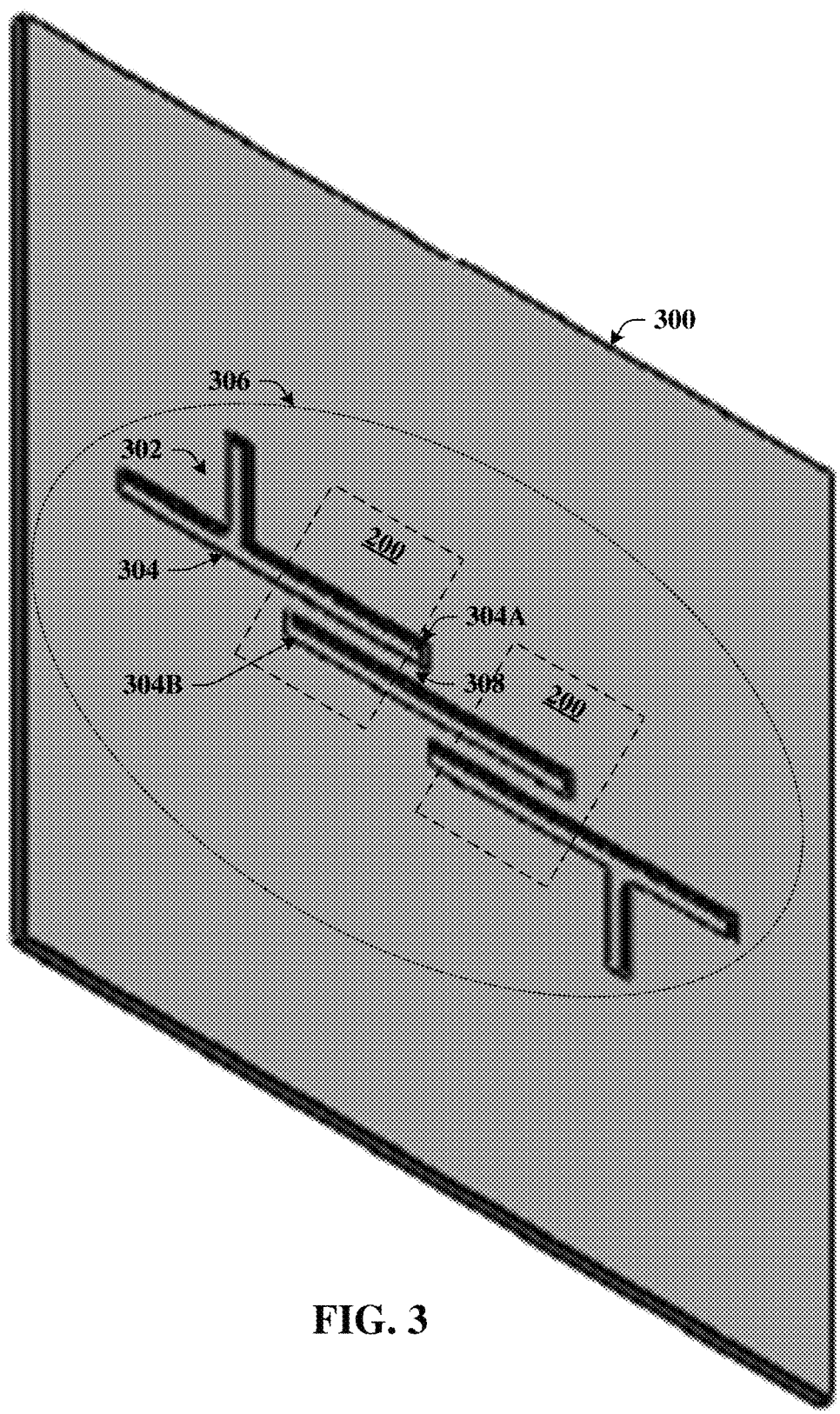
FIG. 3 illustrates a block diagram of a thermally decoupled cryogenic microwave filter device that can propagate a signal while reducing heat flow in accordance with one or more embodiments.

Turning now to FIG. 3, a block diagram of thermally decoupled cryogenic microwave filter device 300 is illustrated that can propagate a signal while reducing heat flow in accordance with one or more embodiments. Repetitive description of like elements employed in other embodiments described herein is omitted for sake of brevity. For example, thermally decoupled cryogenic microwave filter device 300 can comprise one or more thermal decoupling devices 200.

In that regard, thermally decoupled cryogenic microwave filter device 300 can comprise dielectric 302. Dielectric 302 can have discontinuous channels in a pattern 306 that facilitates a filter operation on a microwave signal propagated in a cryogenic environment having a temperature below about 77 degrees Kelvin. The discontinuous channels can have a first channel that is separated from a second channel by a wall 308 of dielectric 302, an example of which is depicted at FIG. 2.

Thermally decoupled cryogenic microwave filter device 300 can further comprise conductive line 304 that can have multiple discontinuous segments. For instance, conductive line 304 can comprise a first segment 304A, situated in the first channel, and a second segment 304B, situated in the second channel, separated by wall 308. Wall 308 can facilitate propagation of microwave signal through conductive line 304 such as through multiple segments of conductive line 304. Wall 308 can further reduce heat flow between first segment 304A and second segment 304B. Hence, various segments of conductive line 304 can be thermally decoupled, which advantageously can reduce or mitigate thermal noise. Techniques associated with reducing effects of Kapitza resistance can now be described, beginning with FIG. 4.

Figure 4:
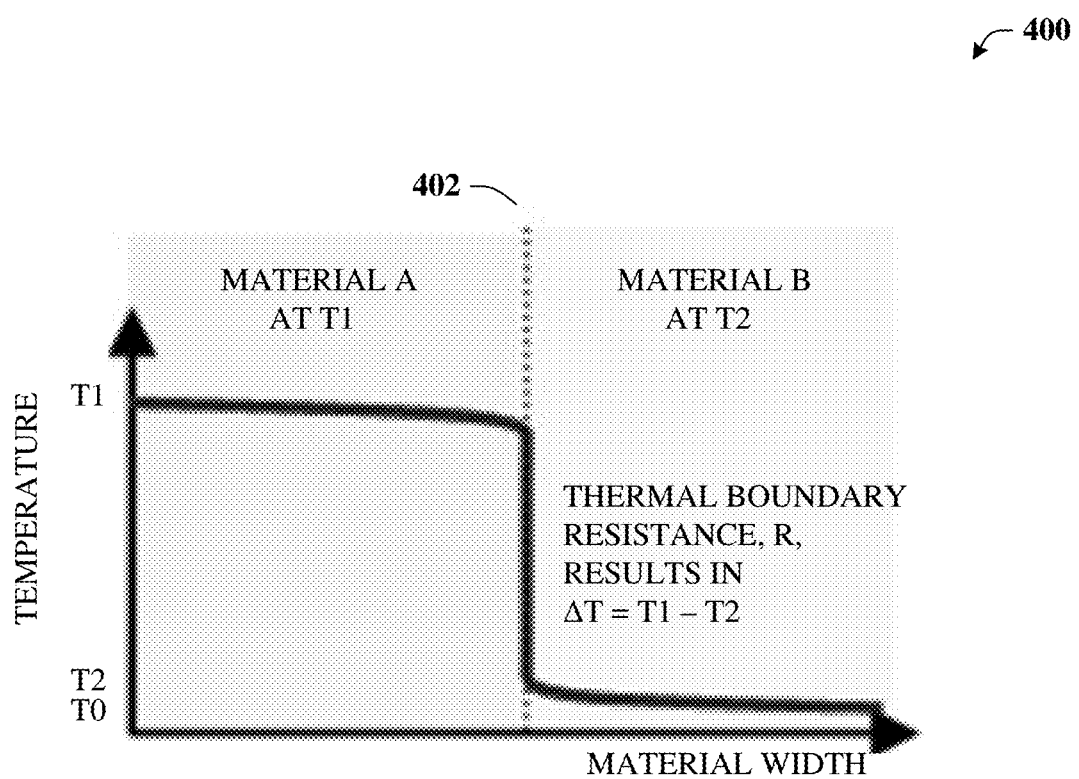
FIG. 4 illustrates a block diagram of system and an overlaid temperature graph illustrating effects of Kapitza resistance in accordance with one or more embodiments.

Referring now to FIG. 4, a block diagram of system 400 and an overlaid temperature graph illustrating effects of Kapitza resistance in accordance with one or more embodiments. Repetitive description of like elements employed in other embodiments described herein is omitted for sake of brevity. System 400 can comprise two different materials that share a boundary interface 402, where one material has contact with the other material. Hence, in this example, material A contacts material B at boundary interface 402. It is assumed in this example that these materials, or the interface between the two materials is subject to a common temperature flux and/or the ambient temperature is the same for both, call it T0. It is further assumed that material A has an initial temperature, T1, and material B has an initial temperature T2 that is lower than T1.

At room temperature, where the effects of Kapitza resistance tend to be negligible, material A and material B will likely settle to a common temperature, as heat flows through boundary interface 402 from material A to material B. However, at cryogenic temperatures, where the effects of Kapitza resistance can be much more significant, thermal boundary resistance, R, creates a temperature drop, $\Delta T$, across boundary interface 402. In other words, the thermal boundary resistance prevents some heat exchange between material A and material B such that material A and material B do not settle to a common temperature.

It is believed this temperature mismatch results due to scattering of energy carriers such as phonons or electrons at boundary interface 402. The probability that an energy carrier scatters at boundary interface 402 instead of transferring heat through the boundary is a function of the energy states of the materials on both sides of boundary interface 402. At cryogenic temperatures, these energy states are lower, yielding a much higher probability of scattering. It has been observed that at low temperatures, such as cryogenic temperatures, the phenomenon of Kapitza resistance, also known as thermal boundary resistance, results in a significant temperature drop, $\Delta T$ at boundary interface 402 that serves as a boundary between two different materials. It is further observed that this temperature drop, $\Delta T$, can lead to technical problems that are further detailed in connection with FIG. 5.

Figure 5:
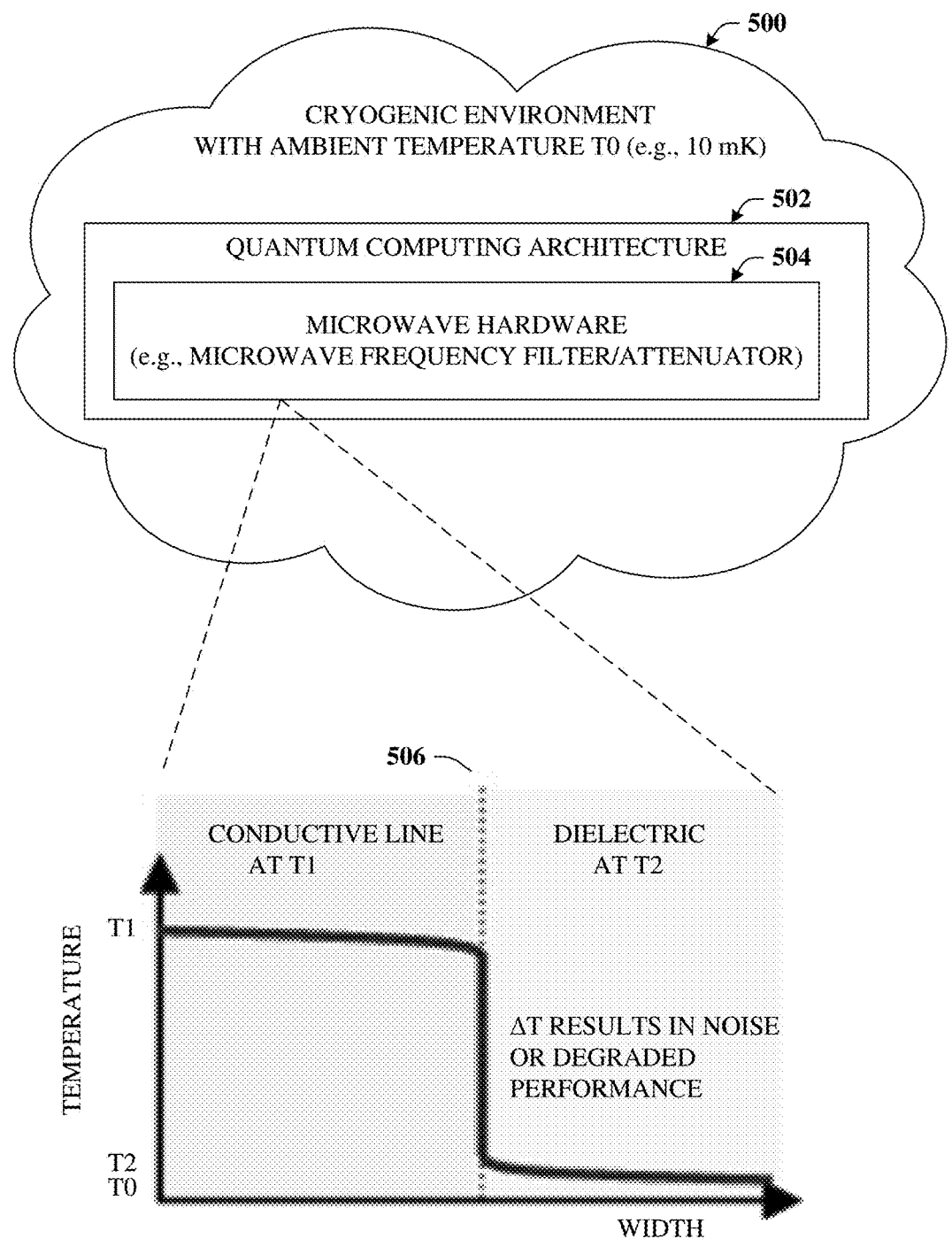
FIG. 5 illustrates a block diagram of cryogenic environment demonstrating problematic results of Kapitza resistance in accordance with one or more embodiments.

With reference now to FIG. 5, a block diagram of cryogenic environment 500 demonstrating problematic results of Kapitza resistance in accordance with one or more embodiments. Repetitive description of like elements employed in other embodiments described herein is omitted for sake of brevity. Cryogenic environment 500 may exhibit a very low pressure or be a vacuum. Cryogenic environment 500 may be refrigerated to a very low temperature such as less than about 77 K, and might in fact be below 4 K, and in some cases 10 millikelvin or less. Within cryogenic environment 500 can be some portion of quantum computing architecture 502.

Quantum computing architecture 502 can comprise various microwave hardware 504 such as, for instance, a microwave frequency filter or attenuator. For example, a microwave frequency filter can be employed for controlling a superconducting qubit of quantum computing architectures 502. The internal structure of the microwave frequency filter can comprise a conductive line situated in a dielectric. Hence, the conductive line shares various instances of boundary interface 506 with the dielectric, which can be similar to that described in connection with material A and material B in FIG. 1. Assuming the temperature flux across boundary interface 506 is T0, conductive line is at T1, and dielectric is at T2, then Kapitza resistance can cause a temperature drop, $\Delta T$, across boundary interface 506. Put differently, the conductive line is not thermalized and maintains a temperature that is higher by $\Delta T$ than the dielectric. It has been observed that temperature differences between the conductive line and dielectric can cause microwave hardware 504 to behave unexpectedly. For example, this temperature difference can result in low frequency noise or other degraded performance of microwave hardware 504. Such can lead to shorter coherence times, increased qubit errors, or other degraded performance of quantum computing architecture 502. In some instances, elements (e.g., the conductive line) of microwave hardware 504 might become superconductive at very low temperatures, in which case the microwave hardware 504 may not function as intended.

A potential solution to the aforementioned technical problems caused by Kapitza resistance at boundary interface 506 can be effectuated by various techniques to reduce Kapitza resistance at boundary interface 506. Such a reduction in the thermal boundary resistance can result in a lower value of $\Delta T$, which can avoid the degraded performance of microwave hardware 504 at very low temperatures.

Figure 6:
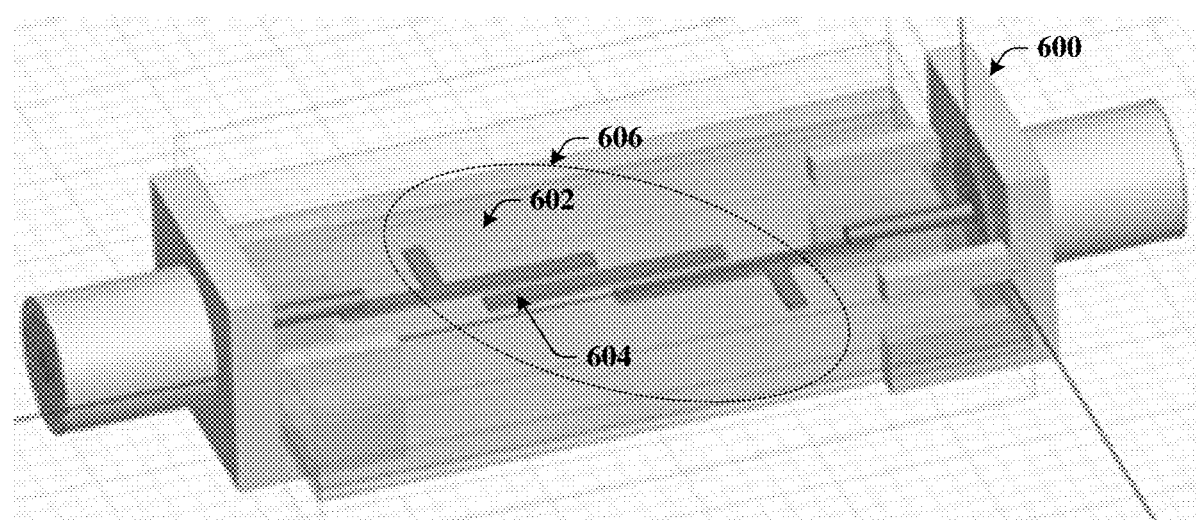
FIG. 6 illustrates a graphical depiction of an example, non-limiting thermally decoupled cryogenic microwave filter having reduced Kapitza resistance in accordance with one or more embodiments.

FIG. 6 is a graphical depiction of an example, non-limiting cryogenic microwave filter 600 having reduced Kapitza resistance in accordance with one or more embodiments. Repetitive description of like elements employed in other embodiments described herein is omitted for sake of brevity. In some embodiments, cryogenic microwave filter 600 can be utilized to control a qubit of a superconducting quantum computing architecture.

Cryogenic microwave filter 600 can comprise substrate 602. Substrate 602 can be formed of a dielectric material determined to have a desirable thermal property. For example, the material can be determined to have a thermal conductivity that is above about 200 watts per meter-Kelvin (W/m-K) at a temperature of 77 degrees Kelvin (K). In some embodiments, the material can be a dielectric material that acts as an electrical insulator. It is appreciated that materials for conventional substrates or dielectrics tend to be selected based on some function of price and desired electrical properties such as being electrically insulating. Without identifying the increased significance of Kapitza resistance at cryogenic temperatures as well as the technical problems said Kapitza resistance can cause in connection with filter devices, there is no apparent reason for filter designers to consider thermal conductivity properties of a dielectric or substrate, particularly in the event that a given thermal conductivity property might increase the cost of a dielectric or substrate without providing improved electrical properties.

However, by selecting a material determined to have a high thermal conductivity, in this example above 200 W/m-K at 77 K, elements that are in contact with substrate 602 (e.g., conductive line 604) can be more effectively thermalized, which can reduce thermal noise. For instance, hot electrons can be more effectively removed from conductive line 604. Since DC signals are not propagated between various segments of conductive line 604, noise associated with DC signals can be reduced or eliminated. A result of reduced noise can be improved performance of associated elements or systems. For example, an associated quantum computing system can realize improved coherence times and fewer qubit errors when relying on cryogenic microwave filter 600 instead of existing microwave filters.

In some embodiments, the material selected for substrate 602 can be sapphire. In some embodiments, the material selected for substrate 602 can be diamond. Other materials are possible, provided such exhibit sufficient thermal conductivity. Both sapphire and diamond have extremely high thermal conductivity, even when compared typical ceramic substrates such as alumina. For example, alumina, which is known to have a high thermal conductivity, but which is one of the most commonly selected materials for a ceramic substrate and/or dielectric due to its low cost and low electrical conductivity has a thermal conductivity of 157 W/m-K at 77 K. By contrast, other materials such as sapphire and diamond have significantly better thermal conductivity at cryogenic temperatures, which is illustrated in Table I.

TABLE I

| Material | Thermal Conductivity (W/m-K) | | | |
|---|---|---|---|---|
| | @ 77 K | @ 20 K | @ 10 K | @ 4 K |
| Alumina | 157 | 24 | 5.2 | 0.49 |
| Sapphire | 1100 | 15700 | 29 | 230 |
| Diamond | 3400 | 1500 | 510 | 67 |

Even though alumina is known to have a high thermal conductivity relative to many other materials, such is typically not high enough, depending on the application. As illustrated in Table I, sapphire and diamond exhibit a thermal conductivity at 77 K that is near to ten (in the case of sapphire) or greater than twenty (in the case of diamond) times higher. At even lower temperatures, e.g., at 4 K, sapphire and diamond can exhibit a thermal conductivity that is more than two orders of magnitude higher than that for alumina. Thus, at cryogenic temperatures, a boundary interface between the substrate and a different material can be expected to have reduced Kapitza resistance and a lower ΔT when the substrate is composed of, e.g., sapphire or diamond than when composed of more common materials such as alumina.

Cryogenic microwave filter 600 can further comprise conductive line 604. Conductive line 604 can be formed in a recess or multiple recesses of substrate 602. Conductive line 604 can facilitate a filter operation on a microwave signal propagated in a cryogenic environment having a temperature below about 77 K.

In some embodiments, the filter operation facilitated by conductive line 604 can be a function of a geometry of the recesses in substrate 602. For example, since conductive line 604 can be formed in these recesses or conductive line 604 can fill some portion of the recess, a pattern of the recesses can provide or facilitate the desired filtering operation. In this example, pattern 606 illustrates one example of a suitable geometry. In some embodiments, the filter operation facilitated by pattern 606 can be a bandpass filter operation, where frequencies of the microwave signal that are within a defined range are passed by the bandpass filter operation and other frequencies beyond the defined range can be filtered or attenuated by the bandpass filter operation.

As one example, pattern 606 may facilitate passing frequencies between 5.5 gigahertz (GHz) and 6.5 GHz, while filtering or attenuating frequencies beyond the band of allowed frequencies such as those below 5.5 GHz or above 6.5 GHz. It is appreciated that the defined range of frequencies that are passed can have a band width of approximately one GHz or some other value depending on the geometry of pattern 606. This band of defined frequencies that are passed, having a width of one GHz or some other width, can be situated substantially anywhere in the microwave spectrum, which is typically between about 300 megahertz (MHz) and 300 GHz. However, for certain applications used in conjunction with quantum computing architectures, filtering or attenuating frequencies within the ranges of between about one GHz and about 10 GHz can be of more significance. For instance, passing frequencies (while attenuating frequencies outside the range) within the defined ranges between about 4.5 GHz to about 5.5 GHz, between about 5.5 GHz to about 6.5 GHz, between about 6.5 GHz to about 7.5 GHz, and so on can be representative of a typical microwave filter.

As has been discussed, cryogenic microwave filter 600 can have significant advantages over other filter devices, particularly with regard to reducing Kapitza resistance and improving thermalization. The inventors have identified that Kapitza resistance can be reduced by increasing the surface contact area between substrate 602 and conductive line 604, techniques for which are detailed below. The inventors have further identified that improved thermalization can be realized by selecting materials for cryogenic microwave filter 600 that have a very high thermal conductivity, which can, e.g., improve the efficacy transferring hot electrons away from conductive line 604. As detailed above, such can be in connection with a material selected for substrate 602, in which the selected material has a thermal conductivity that is above about 200 (or some other suitable value) W/m-K, with materials such as sapphire and diamond serving as representative examples. It is further appreciated that materials for conductive line 604 can be selected according to high thermal conductivity properties as well, with some examples given below.

In addition to improving thermalization of conductive line 604, e.g., by increasing thermal conductivity of the materials used in cryogenic microwave filter 600, Kapitza resistance can be reduced as well. For example, consider again boundary interface 506 of FIG. 5, noting that one or more similar boundary interfaces can exist between substrate 602 and conductive line 604. While the interface between two different materials might be represented as a smooth interface, at microscopic scales, the two materials may not be flush across the entire interface, resulting in reduced surface contact area between the two different materials at the boundary interface. This reduced surface contact area represents a technological problem because such results in higher Kapitza resistance or a higher $\Delta T$.

The inventors have observed that both $\Delta T$ and Kapitza resistance can be reduced by increasing the surface contact area between conductive line 604 and substrate 602 and have further determined that such can be accomplished in distinct ways. For example, conductive line 604 can be constructed or formed in such a way that contact at the boundary interface is more flush. As another example, the pressure at the boundary interface can be increased, resulting in more surface contact area.

A technique that can be employed to advantageously leverage both techniques can be to sinter conductive line 604. In other words, conductive line 604 can comprise a conductive material that has been sintered in the recesses of substrate 602. Additional information regarding sintering techniques can be found with reference to FIG. 10. However, it is understood that by sintering conductive line 604, surface contact area at the boundary interface between two materials can be increased, due in part to both creating a better "fit" with the surface of substrate 602 and by exhibiting increased pressure at the interface that tends to smooth out microscopic imperfections where contact might otherwise not exist.

As can be further observed from pattern 606 that is representative of a pattern for conductive line 604, various operations of the filter can be performed by measuring radio frequency (RF) signals. Because conductive line 604 is discontinuous or segmented, DC measurements may not be fully supported. Such is not necessarily a drawback because qubits typically operate at high frequencies (e.g., above 1 GHz) and DC measurements are not used very often for such applications. Moreover, given that DC signals can deliver low frequency noise that can negatively impact qubits, blocking DC signals can be beneficial.

Figure 7:
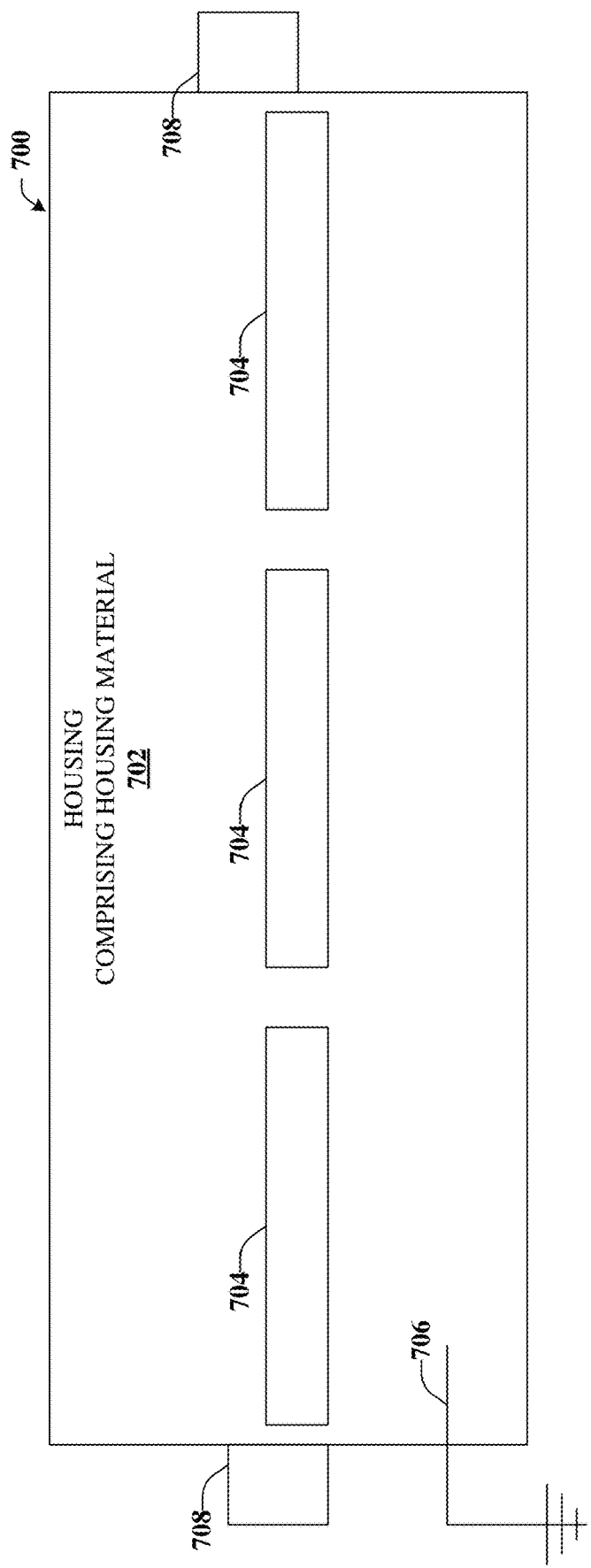
FIG. 7 illustrates a block diagram of an example housing for the cryogenic microwave filter in accordance with one or more embodiments.

Referring now to FIG. 7, an example housing 700 for the cryogenic microwave filter 600 in accordance with one or more embodiments. Repetitive description of like elements employed in other embodiments described herein is omitted for sake of brevity. Housing 700 can encase all or a portion of other components of cryogenic microwave filter 600. Housing 700 can comprise housing material 702 that can have various advantageous properties. For example, in some embodiments, housing material 702 can be formed of an oxygen-free material. In some embodiments, housing material 702 can be electrolytic copper or similar. In some embodiments, housing material 702 can shield elements of a cryogenic microwave filter (e.g., cryogenic microwave filter 600) from microwave noise, which can provide further improved performance.

As illustrated by grooves 704, housing 700 can be configured to couple to refrigerator plates or other cryogenic elements that facilitate a transfer of thermal energy away from housing 700 or that operate as a thermal sink. In some embodiments, housing 700 can be coupled to an electrical ground, as illustrated by reference numeral 706. Further still, housing 700 can be integrated into a suitable quantum computing architecture, such as being incorporated into a qubit housing. Connectors 708 can be single pole or high-density microwave connectors such as, e.g., SMP, SMA, Ardent, and so forth. In some embodiments, connectors 708 on both ends of housing 700 or cryogenic microwave filter 600 can have the same gender (e.g., both male or both female). Such a configuration can reduce the number of connections on the qubit control lines, resulting in a reduced number of reflection points and, hence, improved performance.

Figure 8:
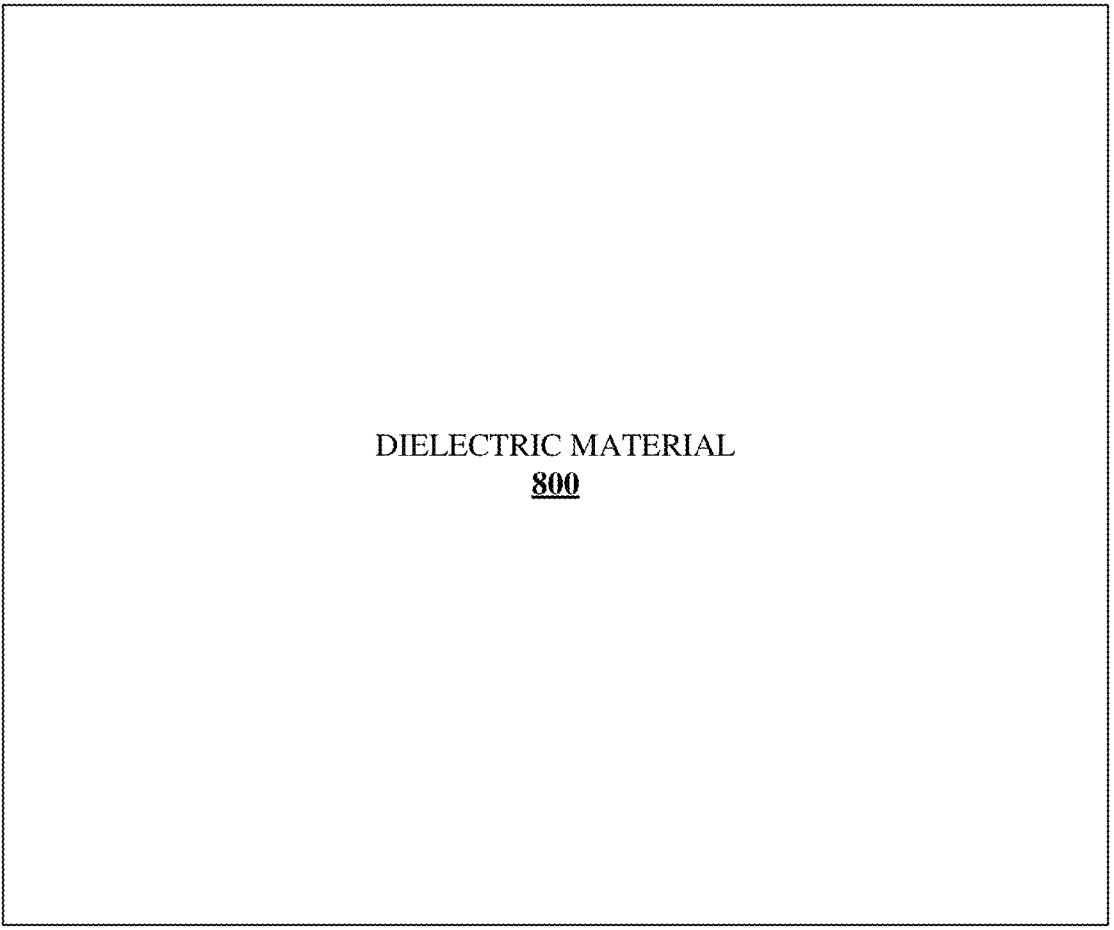
FIGS. 8-10 illustrate a process by which a thermal decoupling product or a suitable thermally decoupled cryogenic microwave filter product can be produced in accordance with one or more embodiments.
Figure 9:
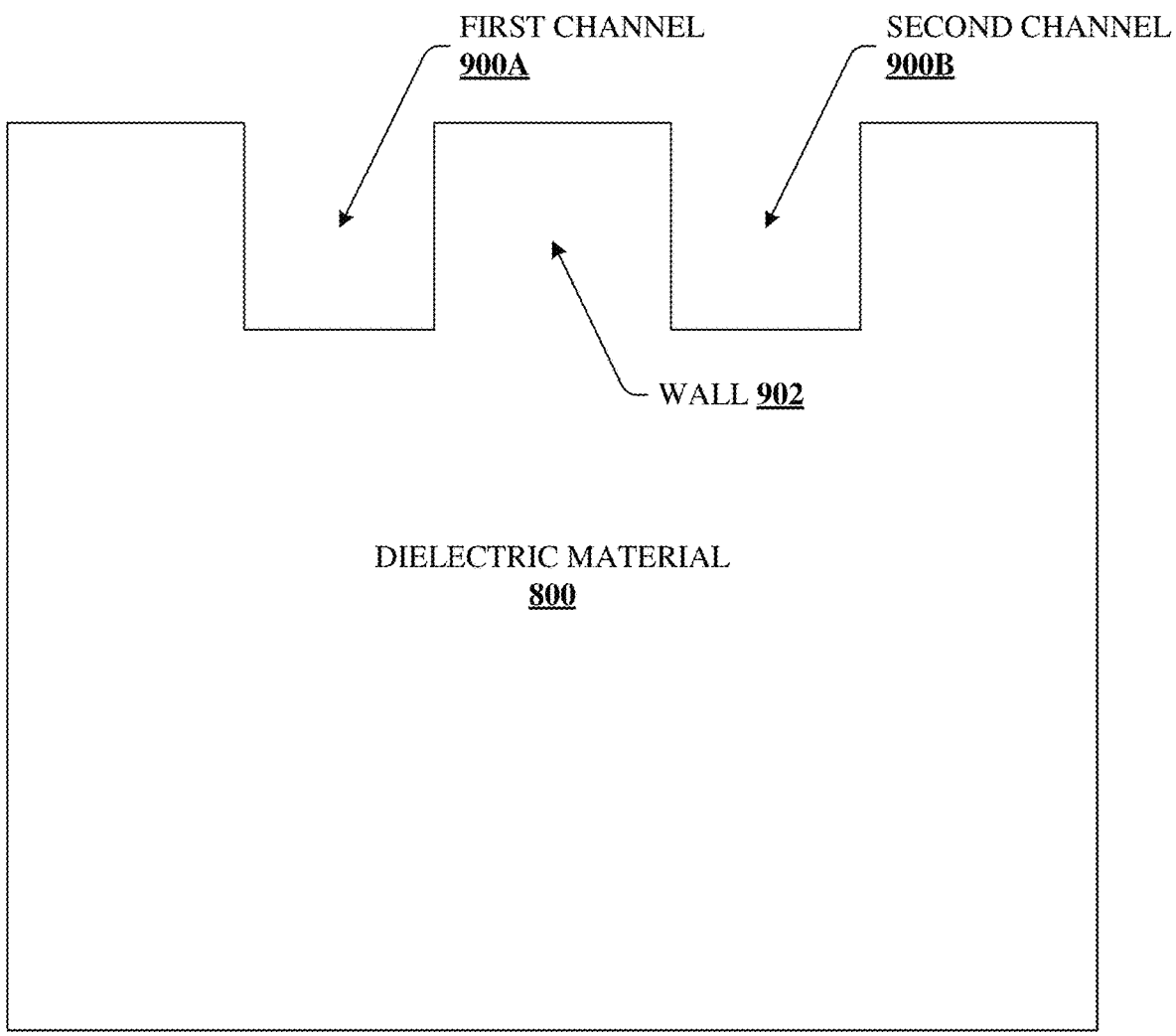
Figure 10:
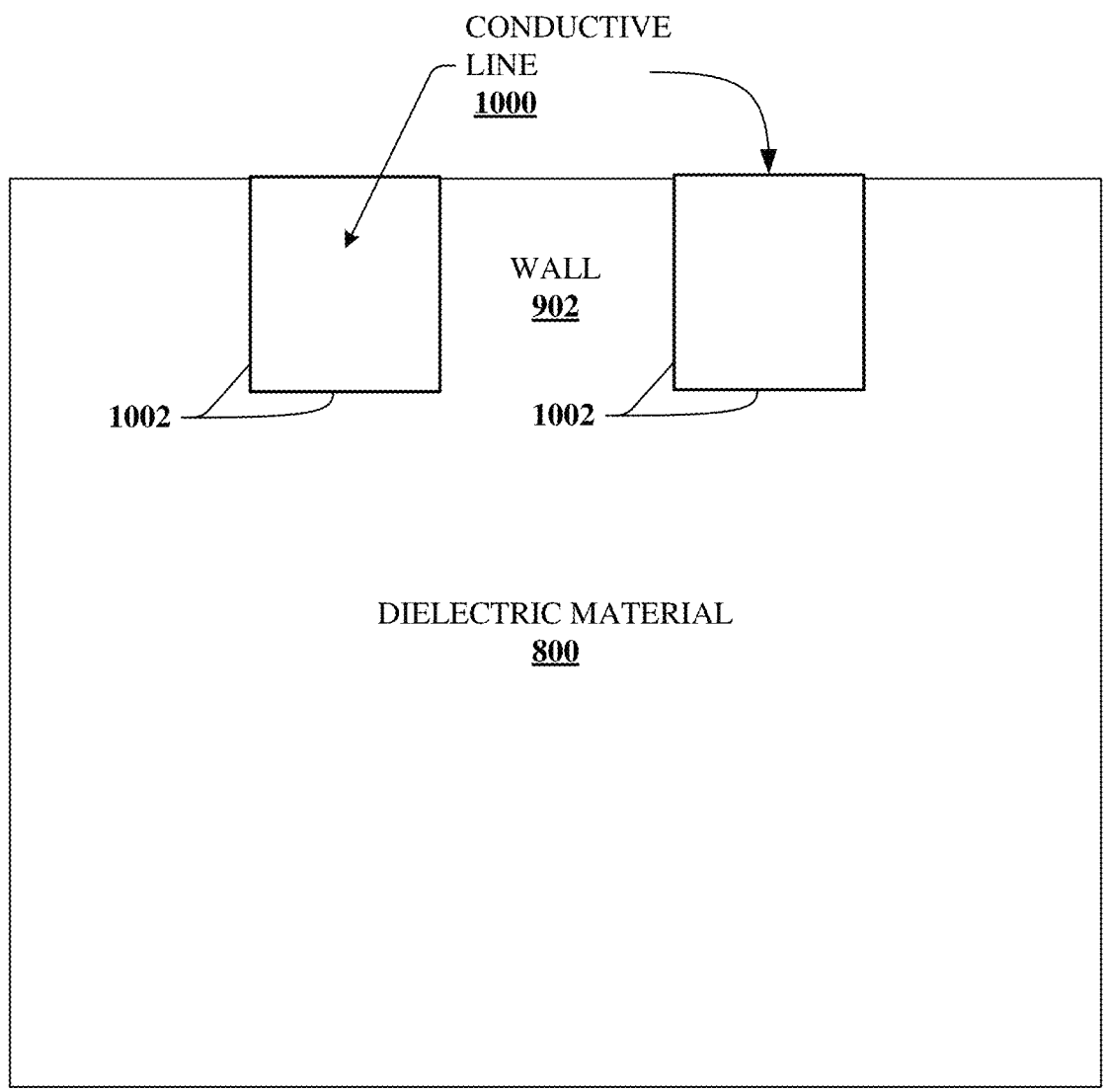

FIGS. 8-10 illustrate a process by which a suitable thermal decoupling product can be produced in accordance with one or more embodiments. Repetitive description of like elements employed in other embodiments described herein is omitted for sake of brevity. In some embodiments, the thermal decoupling product can be representative of thermal decoupling device 200 of FIG. 2. In some embodiments, the thermal decoupling product can be representative of a portion of thermally decoupled cryogenic microwave filter device 300 or cryogenic microwave filter 600. In FIGS. 8-10, thermal decoupling product is show as a cross-section view being depicted at various stages of the process being illustrated.

In that regard, FIG. 8 illustrates forming, e.g., by a fabrication device, dielectric 800. The fabrication device can be controlled by computing elements that comprise a processor and a memory that stores executable instructions that, when executed by the processor, facilitate performance of operations. Examples of said processor and memory, as well as other suitable computer or computing-based elements, can be found with reference to FIG. 15.

In some embodiments, dielectric material 800 can be a substrate such as substrate 602. For example, dielectric material 800 can operate as an electrical insulator and a thermal conductor at cryogenic temperatures below about 77 K. Dielectric material 800 can comprise a material having a thermal conductivity that is above about 200 W/m-K at 77 K. It is understood that the thermal conductivity selected to satisfy a particular application can depend on the application, so other thermal conductivity values can be selected, depending on the application or implementation. For instance, for a different application, the material of dielectric material 800 can be selected to have a thermal conductivity that is, e.g., above 1000 W/m-K at a temperature of 77 K, above 1000 W/m-K at a temperature of 20 K, above 20 W/m-K at a temperature of 10 K, and above 10 W/m-K at a temperature of 4 K, or any suitable thermal conductivity value at any cryogenic temperature. Table I above, demonstrates that these example thermal conductivity values at the various temperatures readily distinguish from commonly used dielectrics such as alumina. As discussed, selecting a material with an appropriately high thermal conductivity can significantly reduce Kapitza resistance and significantly reduce the temperature drop, $\Delta T$, at the boundary interface.

FIG. 9 illustrates forming, e.g., by the fabrication device, channels in dielectric material 800 in accordance with one or more embodiments. Repetitive description of like elements employed in other embodiments described herein is omitted for sake of brevity. For example, the fabrication device can form a channel 900A and a channel 900B. Channel 900A can be separated from channel 900B by wall 902 of the dielectric material 800. In some embodiments, a pattern of the channels can be configured as a function of a filter operation for electromagnetic radiation having frequencies within a microwave spectrum, such as between 300 MHz and 300 GHz. A representative example (shown from an overhead view) of this pattern that can provide such behavior can be pattern 606. Thus, in addition to channels 900A and 900B being discontinuous and separated by wall 902, in some embodiments, channels 900A and 900B can be representative of a cross-section of the pattern 606. Channels 900A and 900B can be created by pattern and etching techniques or any other suitable technique.

FIG. 10 illustrates conductive line 1000 formed in channels 900A and 900B in accordance with one or more embodiments. Repetitive description of like elements employed in other embodiments described herein is omitted for sake of brevity. For example, the fabrication device can form a conductive line comprising a first segment formed in channel 900A and a second segment formed in channel 900B. The first segment of conductive line 1000 can be separated from the second segment by wall 902. Wall 902 can be configured to allow propagation of a microwave signal (or a signal with sufficiently excited electrons) between the first segment and the second segment. Further, wall 902 can reduce heat flow between the first segment and the second segment of conductive line 1000.

In some embodiments, conductive line 1000 can be formed of a sintered conductive material. For example, conductive line 1000 can result from sintering, e.g., by the fabrication device, a conductive material in channels 900A and 900B. Additional detail relating to sintering can be found in connection with FIG. 13.

It is understood that various boundary interfaces 1002 can exist between conductive line 1000 and dielectric material 800. As has been described, dielectric material 800 can comprise a material be selected to have very high thermal conductivity. Likewise, a conductive material having high thermal conductivity can be selected in connection with conductive line 1000. Using materials with high thermal conductivity can improve thermalization of the conductive line, thereby improving the performance of the cryogenic microwave filter product. Furthermore, by sintering the conductive material, surface contact area can be increased at boundary interfaces 1002, which can reduce Kapitza resistance and further improve performance in cryogenic environments.

FIGS. 11-14 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts can occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts need occur to implement a given methodology in accordance with the disclosed subject matter. Additionally, it should be further appreciated that the methodologies disclosed hereinafter and throughout this specification are capable of being stored on an article of manufacture to facilitate transporting and transferring such methodologies to computers.

Figure 11:
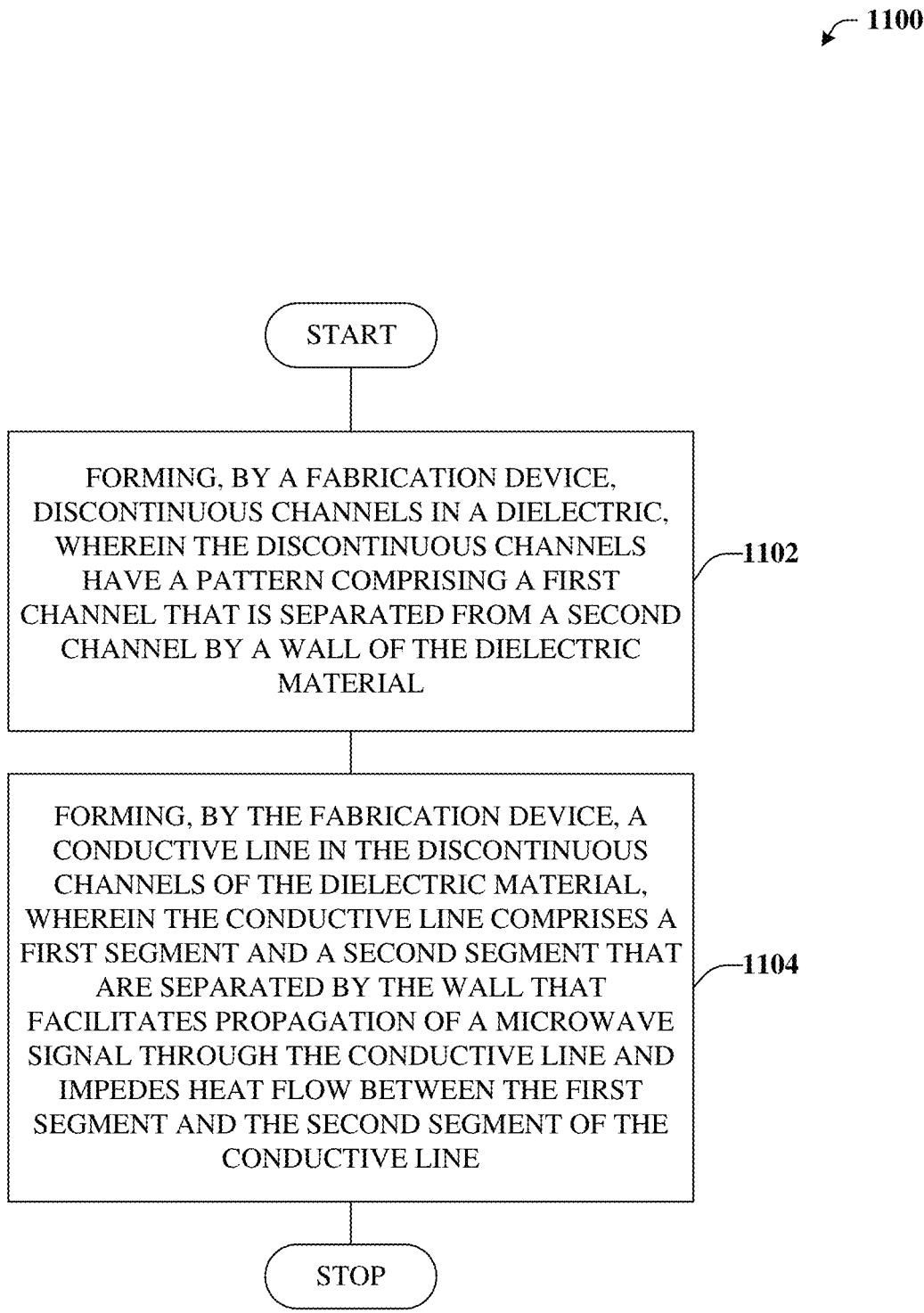
FIG. 11 illustrates a flow diagram of an example, non-limiting method for fabricating a thermal decoupling device in accordance with one or more embodiments.

FIG. 11 illustrates a flow diagram 1100 of an example, non-limiting method for fabricating a thermal decoupling device in accordance with one or more embodiments. Repetitive description of like elements employed in other embodiments described herein is omitted for sake of brevity. At reference numeral 1102, a fabrication device can form discontinuous channels in a dielectric. The discontinuous channels can have a pattern comprising a first channel that is separated from a second channel by a wall of the dielectric material.

At reference numeral 1104, the fabrication device can form a conductive line in the discontinuous channels of the dielectric material. The conductive line can comprise a first segment and a second segment that are separated by the wall. The wall can facilitate propagation of a microwave signal between the first segment and the second segment of the conductive line and can reduce heat flow between the first segment and the second segment of the conductive line. In some embodiments, the forming the conductive line can comprise sintering a conductive material in the discontinuous channels.

Figure 12:
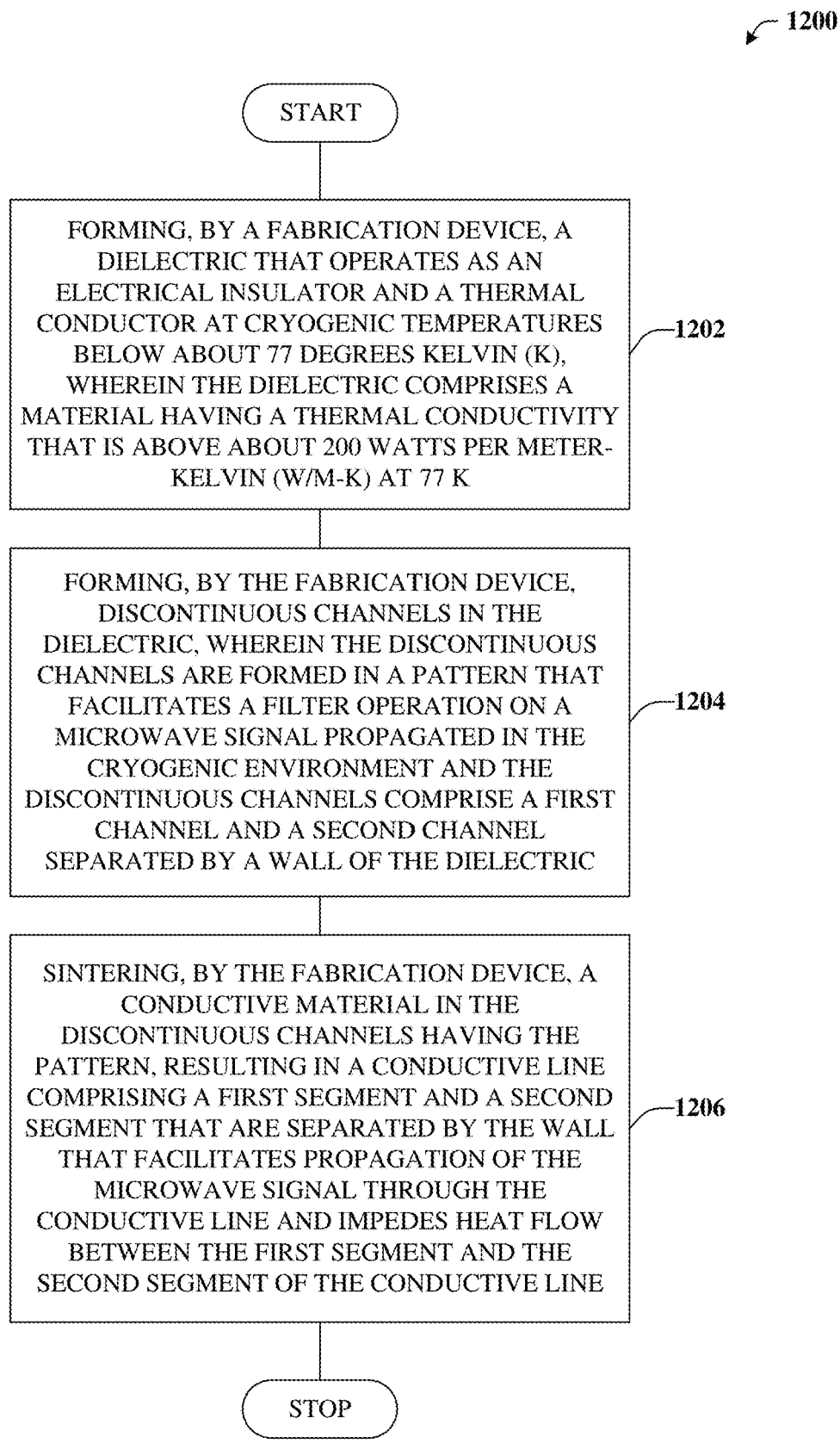
FIG. 12 illustrates a flow diagram of an example, non-limiting method for fabricating a thermally decoupled cryogenic microwave filter in accordance with one or more embodiments.

FIG. 12 illustrates a flow diagram 1200 of an example, non-limiting method for fabricating a thermally decoupled cryogenic microwave filter in accordance with one or more embodiments. Repetitive description of like elements employed in other embodiments described herein is omitted for sake of brevity. At reference numeral 1202, a fabrication device can form a dielectric that operates as an electrical insulator and a thermal conductor at cryogenic temperatures below about 77 K. In that regard, the dielectric can comprise a material having a thermal conductivity that is above about 200 W/m-K at 77 K. By selecting the material to have a thermal conductivity above the designated threshold (in this case above about 200 W/m-K at 77 K), heat exchange between the conductive line and the dielectric can be improved, which can improve the performance of the cryogenic microwave filter when operating in very low temperature environments. Suitable examples of the material can include a sapphire material, a diamond material, or others.

At reference numeral 1204, the fabrication device can form discontinuous channels in the dielectric. The discontinuous channels can be formed in a pattern that facilitates a filter operation on a microwave signal propagated in the cryogenic environment. The discontinuous channels can comprise a first channel and a second channel separated by a wall of the dielectric. Generally, a microwave signal is characterized as a signal having a frequency in a range between about 300 MHz and about 300 GHz. In some embodiments, the wall can have dimensions determined to propagate the microwave signal based on the microwave signal having a frequency that is above about one GHz.

At reference numeral 1206, the fabrication device can form a conductive line in the discontinuous channels of the dielectric material. The conductive line can comprise a first segment and a second segment that are separated by the wall. The wall can facilitate propagation of a microwave signal between the first segment and the second segment and can reduce heat flow between the first segment and the second segment of the conductive line. By reducing heat flow between the first and second segments, thermal noise in the vicinity of the conductive line can be reduced, which can result in an improved signal.

As noted, this conductive line can operate as a microwave filter based on the geometry of the channels. In some embodiments, the forming the conductive line can comprise sintering a conductive material in the discontinuous channels. It is further noted that by sintering the conductive material, the resultant sintered conductive line can have reduced Kapitza resistance at the boundary interface(s) between the conductive line and the dielectric. This reduced Kapitza resistance can be due in part to an increased surface contact area at the boundary interface(s) resulting from the sintering process.

Figure 13:
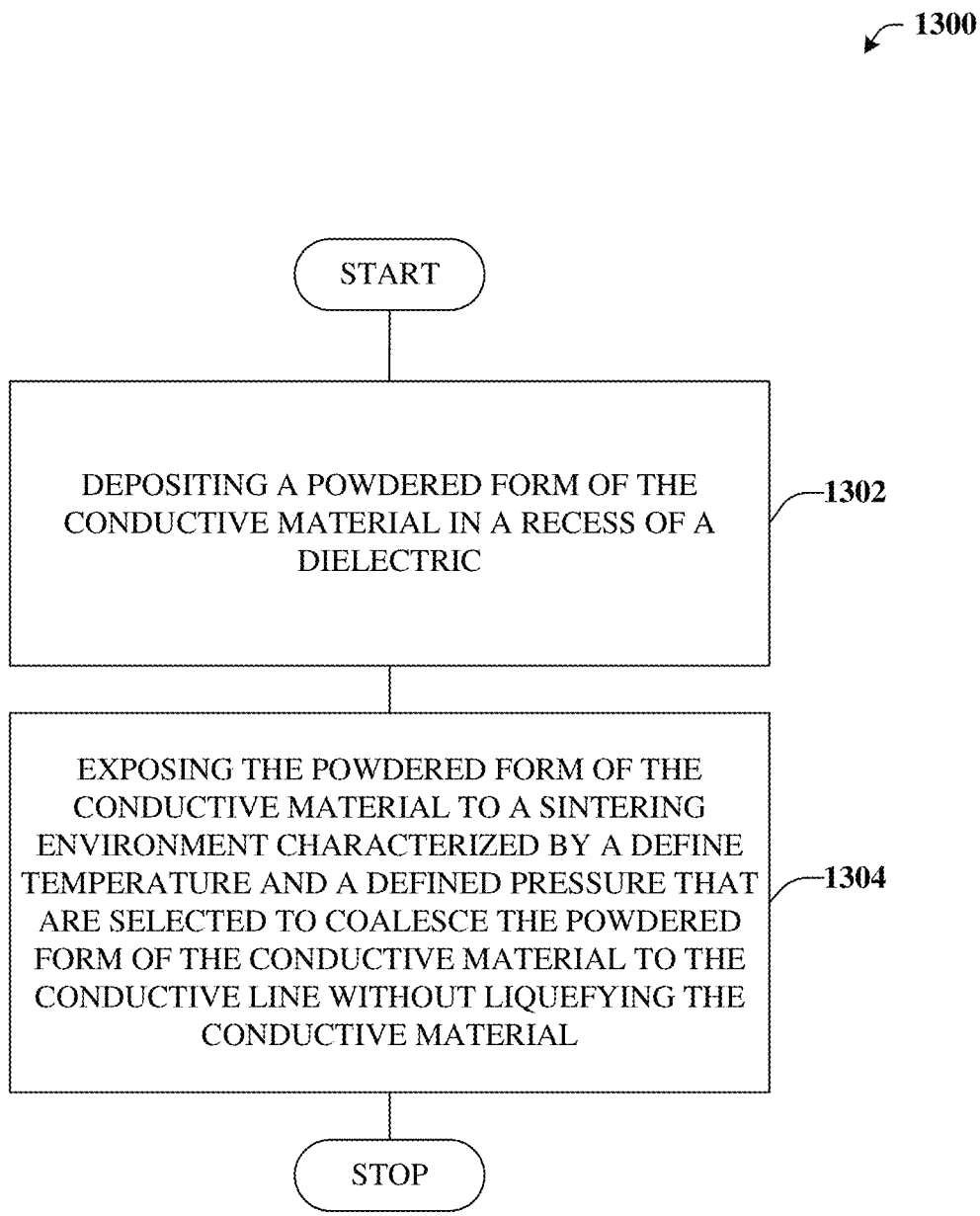
FIG. 13 illustrates a flow diagram of an example, non-limiting method for sintering a conductive material in accordance with one or more embodiments.

FIG. 13 illustrates a flow diagram 1300 of an example, non-limiting method for sintering a conductive material in accordance with one or more embodiments. Repetitive description of like elements employed in other embodiments described herein is omitted for sake of brevity. At reference numeral 1302, fabrication device can deposit a powdered form of the conductive material in the recess of the substrate. The powdered form of the conductive material can be one that is selected to for exceptional thermal conductivity properties, which, as detailed in connection with the material of the substrate can improve the performance of the filter at low temperatures by reducing the temperature drop at the boundary of the conductive line and the substrate. In some embodiments, the powdered form of the conductive material can be one of powdered gold, powdered copper, powdered silver, and powdered aluminum.

At reference numeral 1304, the fabrication device can expose the powdered form of the conductive material to a sintering environment or sintering conditions. The sintering environment or conditions can be characterized by a define temperature and a defined pressure that are selected to coalesce the powdered form of the conductive material to the conductive line without liquefying the conductive material. By employing a sintering technique in connection with the conductive line, higher surface contact area can be achieved between the dielectric and the conductive line, which can operate to reduce Kapitza resistance at low temperatures, and thus improve performance of the cryogenic microwave filter at low temperatures.

Figure 14:
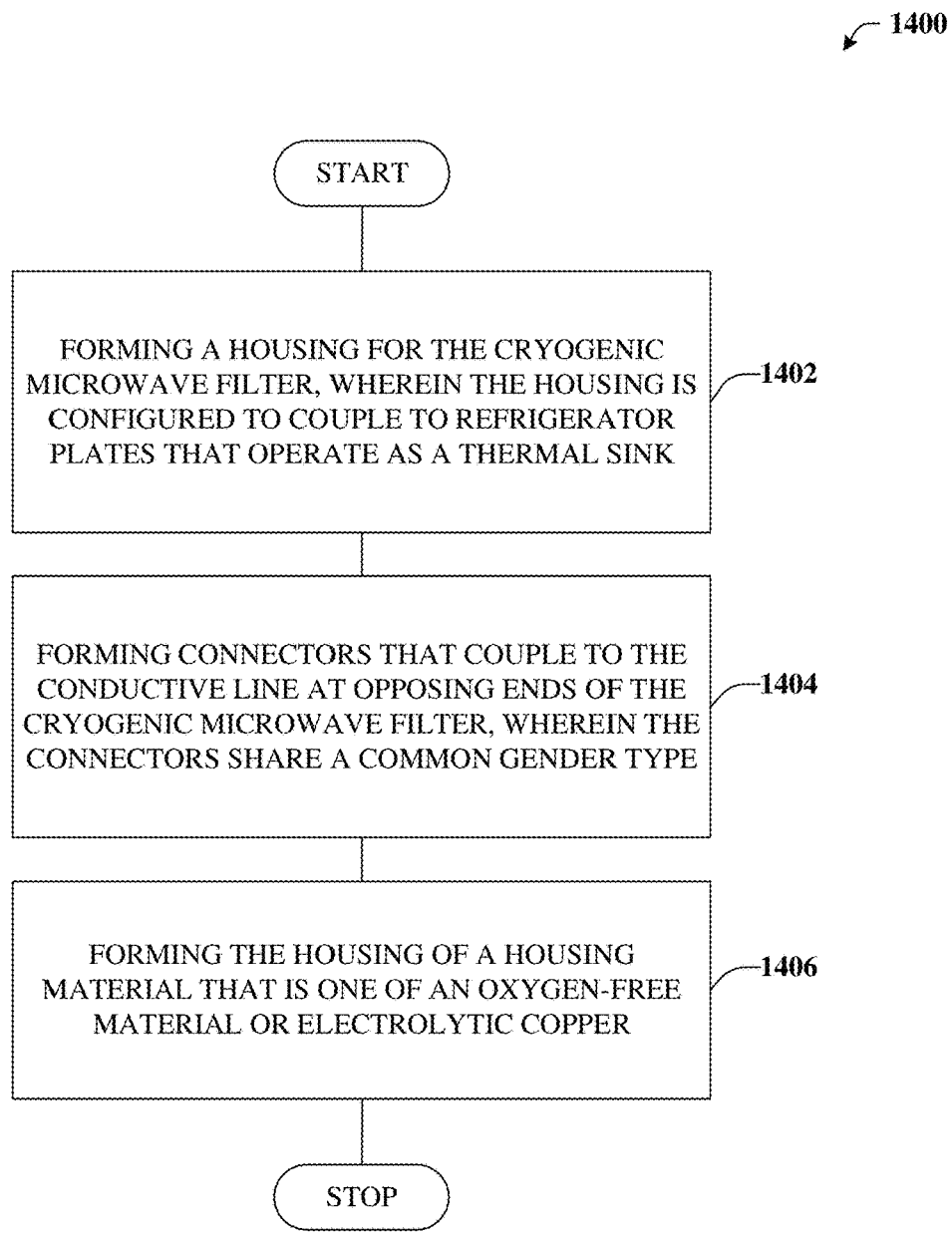
FIG. 14 illustrates a flow diagram of an example, non-limiting method for fabricating a housing for a cryogenic microwave filter in accordance with one or more embodiments.

Turning now to FIG. 14, a flow diagram 1400 if illustrated of an example, non-limiting method for fabricating a housing for a cryogenic microwave filter in accordance with one or more embodiments. Repetitive description of like elements employed in other embodiments described herein is omitted for sake of brevity. At reference numeral 1402, the fabrication device can form or assemble a housing for the cryogenic microwave filter. The housing can be configured to couple to refrigerator plates that operate as a thermal sink.

At reference numeral 1404, the fabrication device can form or assemble connectors. The connectors can couple to the conductive line at opposing ends of the cryogenic microwave filter. In some embodiments, the connectors can share a common gender type. For example, the connectors at both ends of the filter can both be male type connectors or can both be female type connectors. An advantage that can be realized by such an arrangement can be that the number of connections on the qubit control lines can be reduced, which can result in a reduced number of reflection points. As such, cleaner microwave control pulses can be provided and performance of the filter can be improved.

At reference numeral 1406, the fabrication device can form the housing of a housing material that is selected to improve thermalization as well as potentially shield filter elements from noise. In some embodiments, the housing material can be an oxygen-free material. In some embodiments, the housing material can be electrolytic copper.

It is understood that the present invention can be a system, a method, and/or a product form by a specified process. Certain technical applications of the invention can be provided by a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create ways for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession may, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In connection with FIG. 15, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which can be explicitly illustrated herein.

Figure 15:
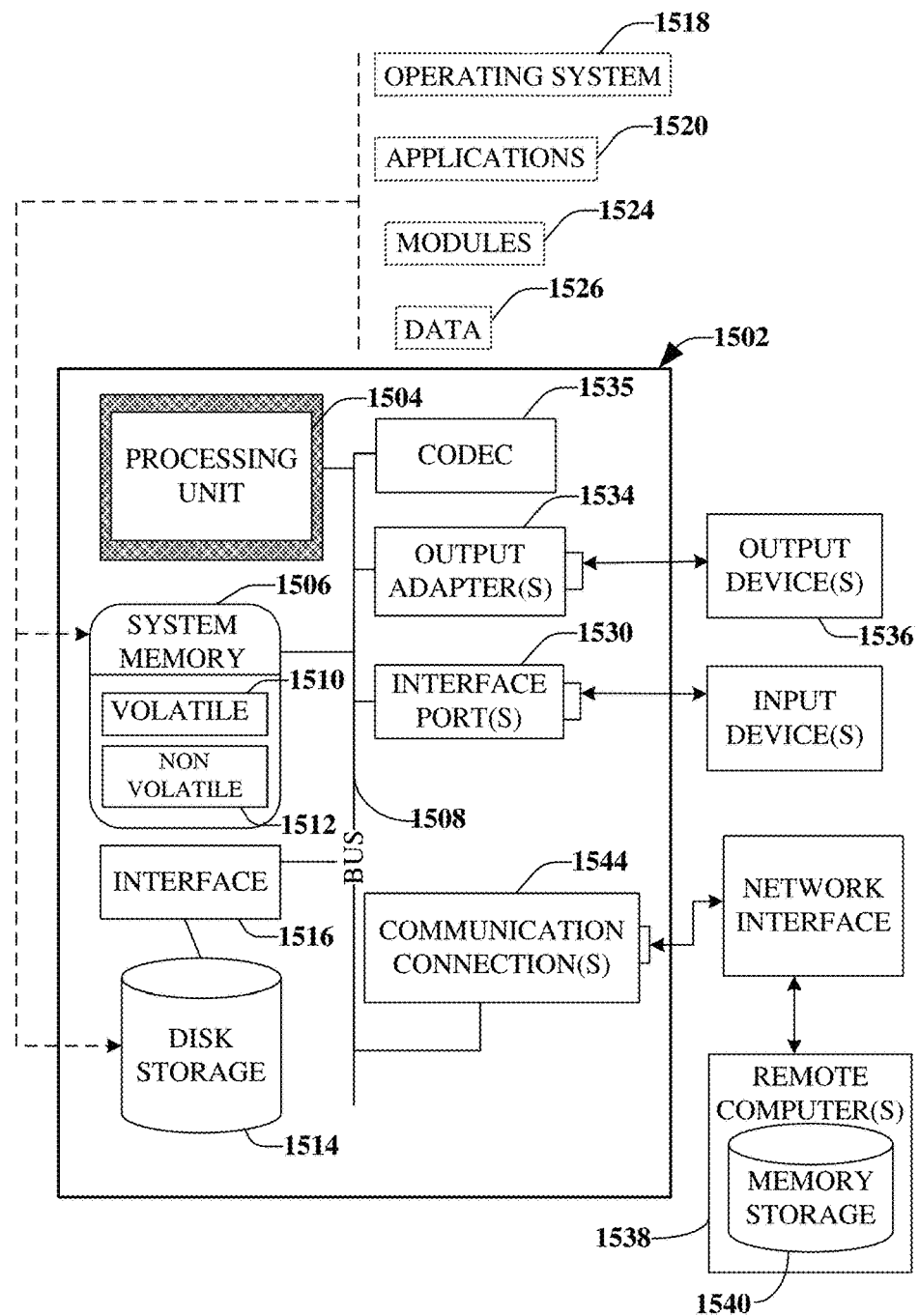
FIG. 15 illustrates a block diagram of an example, non-limiting operating environment in which one or more embodiments described herein can be facilitated.

With reference to FIG. 15, an example environment 1500 for implementing various aspects of the claimed subject matter includes a computer 1502. The computer 1502 includes a processing unit 1504, a system memory 1506, a codec 1535, and a system bus 1508. The system bus 1508 couples system components including, but not limited to, the system memory 1506 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1506 includes volatile memory 1510 and non-volatile memory 1512, which can employ one or more of the disclosed memory architectures, in various embodiments. The basic input/output system (BIOS), containing the basic routines to transfer information between elements within the computer 1502, such as during start-up, is stored in non-volatile memory 1512. In addition, according to present innovations, codec 1535 can include at least one of an encoder or decoder, wherein the at least one of an encoder or decoder can consist of hardware, software, or a combination of hardware and software. Although, codec 1535 is depicted as a separate component, codec 1535 can be contained within non-volatile memory 1512. By way of illustration, and not limitation, non-volatile memory 1512 can include read only memory (ROM), programmable ROM (PROM), electrically programmable ROM (EPROM), electrically erasable programmable ROM (EEPROM), Flash memory, 3D Flash memory, or resistive memory such as resistive random access memory (RRAM). Non-volatile memory 1512 can employ one or more of the disclosed memory devices, in at least some embodiments. Moreover, non-volatile memory 1512 can be computer memory (e.g., physically integrated with computer 1502 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1510 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1502 can also include removable/non-removable, volatile/non-volatile computer storage medium. FIG. 15 illustrates, for example, disk storage 1514. Disk storage 1514 includes, but is not limited to, devices like a magnetic disk drive, solid state disk (SSD), flash memory card, or memory stick. In addition, disk storage 1514 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1514 to the system bus 1508, a removable or non-removable interface is typically used, such as interface 1516. It is appreciated that storage devices 1514 can store information related to a user. Such information might be stored at or provided to a server or to an application running on a user device. In one embodiment, the user can be notified (e.g., by way of output device(s) 1536) of the types of information that are stored to disk storage 1514 or transmitted to the server or application. The user can be provided the opportunity to opt-in or opt-out of having such information collected or shared with the server or application (e.g., by way of input from input device(s) 1528).

It is to be appreciated that FIG. 15 describes software that acts as an intermediary between users and the basic computer resources described in the suitable operating environment 1500. Such software includes an operating system 1518. Operating system 1518, which can be stored on disk storage 1514, acts to control and allocate resources of the computer system 1502. Applications 1520 take advantage of the management of resources by operating system 1518 through program modules 1524, and program data 1526, such as the boot/shutdown transaction table and the like, stored either in system memory 1506 or on disk storage 1514. It is to be appreciated that the claimed subject matter can be implemented with various operating systems or combinations of operating systems.

A user enters commands or information into the computer 1502 through input device(s) 1528. Input devices 1528 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via interface port(s) 1530. Interface port(s) 1530 include, for example, a serial port, a parallel port, a game port, and a universal serial bus (USB). Output device(s) 1536 use some of the same type of ports as input device(s) 1528. Thus, for example, a USB port can be used to provide input to computer 1502 and to output information from computer 1502 to an output device 1536. Output adapter 1534 is provided to illustrate that there are some output devices 1536 like monitors, speakers, and printers, among other output devices 1536, which require special adapters. The output adapters 1534 include, by way of illustration and not limitation, video and sound cards that provide a way of connection between the output device 1536 and the system bus 1508. It should be noted that other devices or systems of devices provide both input and output capabilities such as remote computer(s) 1538.

Computer 1502 can operate in a networked environment using logical connections to one or more remote computers, such as remote computer(s) 1538. The remote computer(s) 1538 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1540 is illustrated with remote computer(s) 1538. Remote computer(s) 1538 is logically connected to computer 1502 through a network interface 1542 and then connected via communication connection(s) 1544. Network interface 1542 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1544 refers to the hardware/software employed to connect the network interface 1542 to the bus 1508. While communication connection 1544 is shown for illustrative clarity inside computer 1502, it can also be external to computer 1502. The hardware/software necessary for connection to the network interface 1542 includes, for exemplary purposes only, internal and external technologies such as, modems including regular telephone grade modems, cable modems and DSL modems, ISDN adapters, and wired and wireless Ethernet cards, hubs, and routers.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other embodiments to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration and are intended to be non-limiting. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming, by a fabrication device, discontinuous channels in a dielectric, wherein the discontinuous channels have a pattern comprising a first channel that is separated from a second channel by a wall of the dielectric; and
    forming, by the fabrication device, a conductive line in the discontinuous channels of the dielectric material, wherein the conductive line comprises a first segment and a second segment that are separated by the wall that facilitates propagation of a microwave signal between the first segment and the second segment and reduces heat flow between the first segment and the second segment of the conductive line, wherein the forming the conducting line comprises coalescing a powdered form of a conductive material in the discontinuous channel to the conductive line without liquefying the conductive material.

2. The method of claim 1, wherein the forming the conductive line also comprises sintering the conductive material in the discontinuous channels.

3. The method of claim 2, wherein the sintering the conductive material comprises:
    depositing, by the fabrication device, the powdered form of the conductive material in the discontinuous channels.

4. The method of claim 3, wherein the sintering the conductive material further comprises:
    exposing, by the fabrication device, the powdered form of the conductive material to a sintering environment characterized by a defined temperature and a defined pressure.

5. The method of claim 1, wherein the first channel and the second channel are substantially parallel.

6. A method, comprising:
    forming, by a fabrication device, a dielectric that operates as an electrical insulator and a thermal conductor at cryogenic temperatures below about 77 degrees Kelvin (K), wherein the dielectric comprises a material having a thermal conductivity that is above about 200 watts per meter-Kelvin (W/m-K) at 77 K;

forming, by the fabrication device, discontinuous channels in the dielectric, wherein the discontinuous channels are formed in a pattern that facilitates a filter operation on a microwave signal propagated in a cryogenic environment and the discontinuous channels comprise a first channel and a second channel separated by a wall of the dielectric;

sintering, by the fabrication device, a conductive material in the discontinuous channels having the pattern, resulting in a conductive line comprising a first segment and a second segment that are separated by the wall that facilitates propagation of the microwave signal through the conductive line and reduces heat flow between the first segment and the second segment of the conductive line; and assembling, by the fabrication device, a housing, wherein the housing couples to refrigerator plates that facilitate a transfer of thermal energy away from the housing.

7. The method of claim 6, wherein the forming the discontinuous channels comprises forming the first channel and the second channel separated by the wall having dimensions determined to propagate the microwave signal based on the microwave signal having a defined frequency.

8. The method of claim 7, wherein the defined frequency is above about one gigahertz (GHz).

9. A process, comprising:

forming, by a fabrication device, a first channel that is separated from a second channel by a wall of a dielectric material;

forming, by the fabrication device, a conductive line comprising a first segment, formed in the first channel, and a second segment, formed in the second channel, separated by the wall, wherein the wall allows propagation of a microwave signal between the first segment and the second segment and reduces heat flow between the first segment and the second segment of the conductive line; and assembling, by the fabrication device, a housing, wherein the housing is configured to couple to refrigerator plates that facilitate a transfer of thermal energy away from the housing.

10. A thermal decoupling product formed by a process, comprising:

forming, by a fabrication device, a first channel that is separated from a second channel by a wall of a dielectric material;

forming, by the fabrication device, a conductive line comprising a first segment, formed in the first channel, and a second segment, formed in the second channel, separated by the wall, wherein the wall allows propagation of a microwave signal between the first segment and the second segment and reduces heat flow between the first segment and the second segment of the conductive line; and assembling, by the fabrication device, a housing, wherein the housing is configured to couple to refrigerator plates that facilitate a transfer of thermal energy away from the housing.

11. The thermo decoupling product of claim 10, further comprising forming discontinuous channels, wherein the forming the discontinuous channels comprises forming the first channel and the second channel separated by the wall having dimensions determined to propagate the microwave signal based on the microwave signal having a defined frequency.

12. The thermo decoupling product of claim 11, wherein the defined frequency is above about one gigahertz (GHz).

13. The thermo decoupling product of claim 10, wherein the first channel and the second channel are substantially parallel.

* * * * *